US012598751B2

(12) United States Patent
Kwon et al.

(10) Patent No.: US 12,598,751 B2
(45) Date of Patent: Apr. 7, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Donghoon Kwon, Suwon-si (KR); Beomjin Park, Suwon-si (KR); Boun Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 501 days.

(21) Appl. No.: 18/190,876

(22) Filed: Mar. 27, 2023

(65) Prior Publication Data

US 2023/0422501 A1 Dec. 28, 2023

(30) Foreign Application Priority Data

Jun. 23, 2022 (KR) ........................ 10-2022-0076930

(51) Int. Cl.
H10B 43/27 (2023.01)
H10B 41/27 (2023.01)
(Continued)

(52) U.S. Cl.
CPC ............. H10B 43/27 (2023.02); H10B 41/27 (2023.02); H10B 41/41 (2023.02); H10B 43/40 (2023.02)

(58) Field of Classification Search
CPC ................................. H10B 43/27; H10B 43/20
See application file for complete search history.

(56) References Cited

U.S. PATENT DOCUMENTS 10,748,923 B2 8/2020 Son et al.
2011/0156107 A1 6/2011 Bohr et al.
(Continued)

FOREIGN PATENT DOCUMENTS

CN 112349726 B 1/2022
EP 3975255 A1 3/2022
(Continued)

OTHER PUBLICATIONS

Extended European Search Report issued Nov. 24, 2023 in European Application No. 23178288.9.
(Continued)

*Primary Examiner* — Christopher A Johnson
(74) *Attorney, Agent, or Firm* — Fish & Richardson P.C.

(57) ABSTRACT

A semiconductor device includes a substrate, circuit devices on the substrate, lower interconnection lines electrically connected to the circuit devices, a peripheral region insulating layer covering the lower interconnection lines, a source structure on the peripheral region insulating layer, gate electrodes stacked and spaced apart from each other in a first direction on the source structure, channel structures penetrating through the gate electrodes and each including a channel layer, contact plugs penetrating through the gate electrodes and the source structure, extending in the first direction, and connected to a portion of the lower interconnection lines, and spacer layers between the contact plugs and the source structure and including a material different from a material of the insulating layer in the peripheral region, wherein each of the spacer layers has a first width on an upper surface and has a second width greater than the first width on a lower surface.

20 Claims, 26 Drawing Sheets

(51) Int. Cl.
    *H10B 41/41*       (2023.01)
    *H10B 43/40*       (2023.01)

(56) References Cited

U.S. PATENT DOCUMENTS

| | | |
|---|---|---|
| 2021/0057430 A1 | 2/2021 | Lee |
| 2021/0118902 A1* | 4/2021 | Kanamori ......... H01L 21/31111 |
| 2021/0193672 A1* | 6/2021 | Kim ....................... H10B 43/50 |
| 2021/0202522 A1 | 7/2021 | Baek |
| 2021/0366919 A1 | 11/2021 | Sung et al. |
| 2022/0045083 A1 | 2/2022 | Sim et al. |

FOREIGN PATENT DOCUMENTS

| | | |
|---|---|---|
| KR | 10-2021-0052934 A | 5/2021 |
| KR | 10-2021-0079087 A | 6/2021 |
| KR | 10-2022-0025771 A | 3/2022 |

OTHER PUBLICATIONS

Tsui et al., "Effects of dielectric liners on TDDB lifetime of a Cu/Low-k interconnect," Interconnect Technology Conference, 2004, Proceedings of the IEEE 2004, Jun. 7, 2004.
Notice of Allowance in Korean Appln. No. 10-2022-0076930, mailed on Dec. 17, 2025, 5 pages (with English translation).

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0076930 filed on Jun. 23, 2022 in the Korean Intellectual Property Office, the disclosure of which is incorporated herein by reference in its entirety.

BACKGROUND

Some example embodiments of the present disclosure relate to a semiconductor device and a data storage system including the same.

A semiconductor device able to store high-capacity data in a data storage system requiring data storage has been desired for various applications. Accordingly, a method for increasing data storage capacity of a semiconductor device has been researched.

SUMMARY

Some example embodiments of the present disclosure provide a semiconductor device having improved reliability.

Some example embodiments of the present disclosure provide a data storage system including a semiconductor device having improved reliability.

According to an example embodiment of the present disclosure, a semiconductor device includes a first semiconductor structure including a substrate, circuit devices on the substrate, lower interconnection lines on the circuit devices, and a peripheral region insulating layer covering the lower interconnection lines, and a second semiconductor structure on the first semiconductor structure, having first and second regions, and including a source structure, gate electrodes stacked and spaced apart from each other in a first direction perpendicular to an upper surface of the source structure on the source structure, channel structures penetrating the gate electrodes in the first region, the channel structures extending in the first direction, and each of the channel structures including a channel layer, contact plugs extending in the first direction in the second region, the contact plugs penetrating through the gate electrodes and the source structure and the contact plugs connected to a portion of the lower interconnection lines, and spacer layers between the contact plugs and the source structure, wherein the spacer layers include a material different from a material of the peripheral region insulating layer, wherein each of the contact plugs includes a first portion on the source structure, a second portion surrounded by the spacer layers, and a third portion below the second portion, and wherein the first portion has a first width, the second portion has a second width smaller than the first width, and the third portion has a third width greater than the second width.

According to an example embodiment of the present disclosure, a semiconductor device includes a substrate, circuit devices on the substrate, lower interconnection lines electrically connected to the circuit devices, a peripheral region insulating layer covering the lower interconnection lines, a source structure on the peripheral region insulating layer, gate electrodes stacked and spaced apart from each other in a first direction perpendicular to an upper surface of the source structure on the source structure, channel structures penetrating through the gate electrodes, the channel structures extending in the first direction, and each of the channel structures including a channel layer, contact plugs penetrating through the gate electrodes and the source structure, the contact plugs extending in the first direction and the contact plugs each connected to a portion of the lower interconnection lines, and spacer layers between the contact plugs and the source structure and the spacer layers including a material different from a material of the insulating layer in the peripheral region, wherein each of the spacer layers has a first width on an upper surface and each of the spacer layers has a second width greater than the first width on a lower surface.

According to an example embodiment of the present disclosure, a data storage system includes a semiconductor storage device including a substrate, circuit devices on the substrate, lower interconnection lines electrically connected to the circuit devices, a peripheral region insulating layer covering the lower interconnection lines, a plate layer on the peripheral region insulating layer, gate electrodes stacked and spaced apart from each other in a first direction perpendicular to an upper surface of the plate layer on the plate layer, contact plugs penetrating through the gate electrodes and the plate layer, the contact plugs extending in the first direction, and each of the contact plugs connected to a portion of the lower interconnection lines, spacer layers between the contact plugs and the plate layer and the spacer layers including a material different from a material of the peripheral region insulating layer, and input/output pads electrically connected to the circuit devices, wherein a controller is electrically connected to the semiconductor storage device through the input/output pad and the controller is configured to control the semiconductor storage device, and wherein each of the contact plugs has a first width on a level of a lower surface of the plate layer, and each of the contact plugs has a second width greater than the first width on a lower surface of each of the contact plugs.

BRIEF DESCRIPTION OF DRAWINGS

The above and other example embodiments, features, and advantages of the present disclosure will be more clearly understood from the following detailed description, taken in combination with the accompanying drawings, in which.

DETAILED DESCRIPTION

Hereinafter, some example embodiments of the present disclosure will be described as follows with reference to the accompanying drawings.

Figure 1:
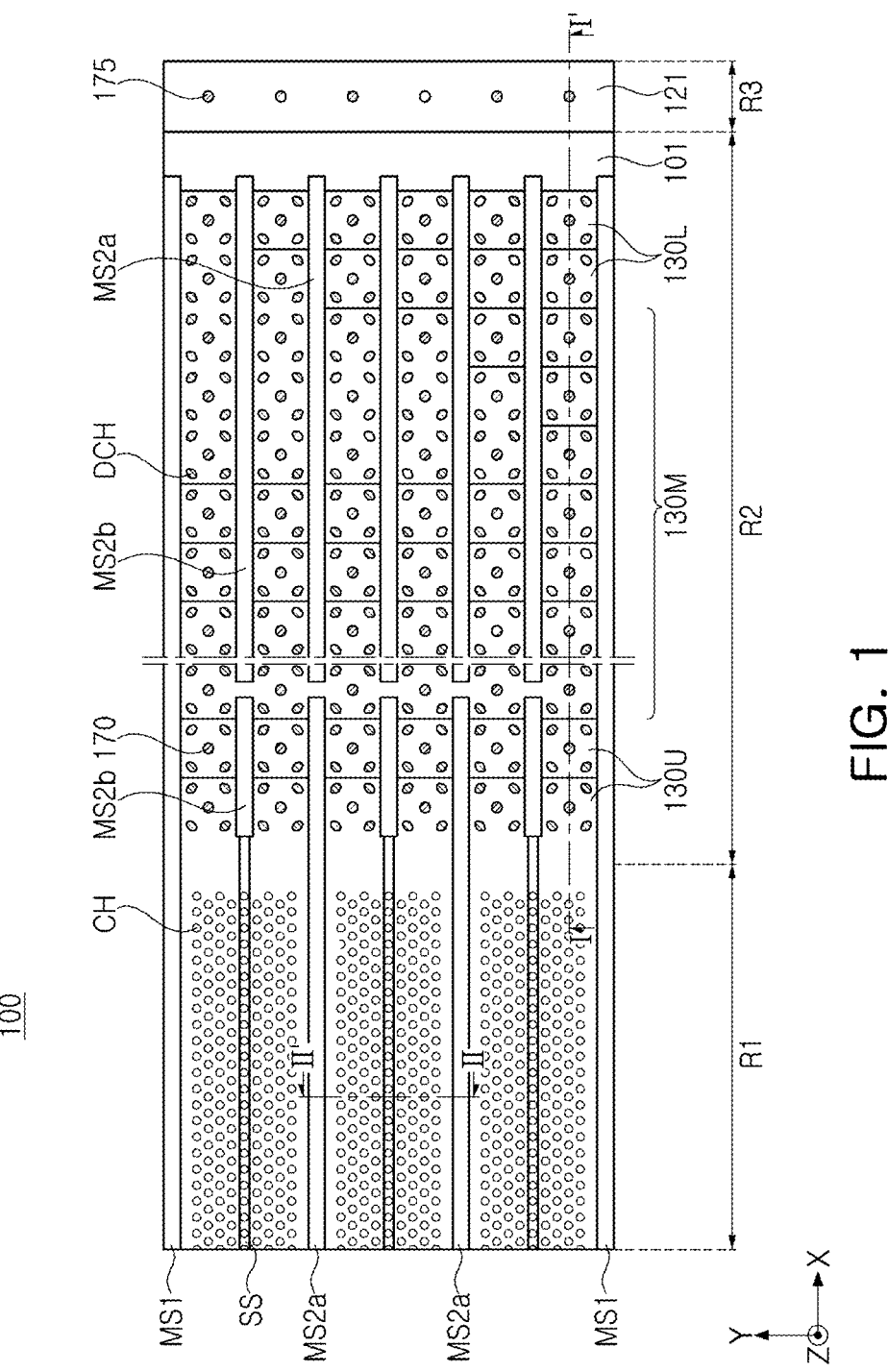
FIG. 1 is a plan view illustrating a semiconductor device according to an example embodiment of the present disclosure.

FIG. 1 is a plan view illustrating a semiconductor device according to an example embodiment.

Figure 2A:
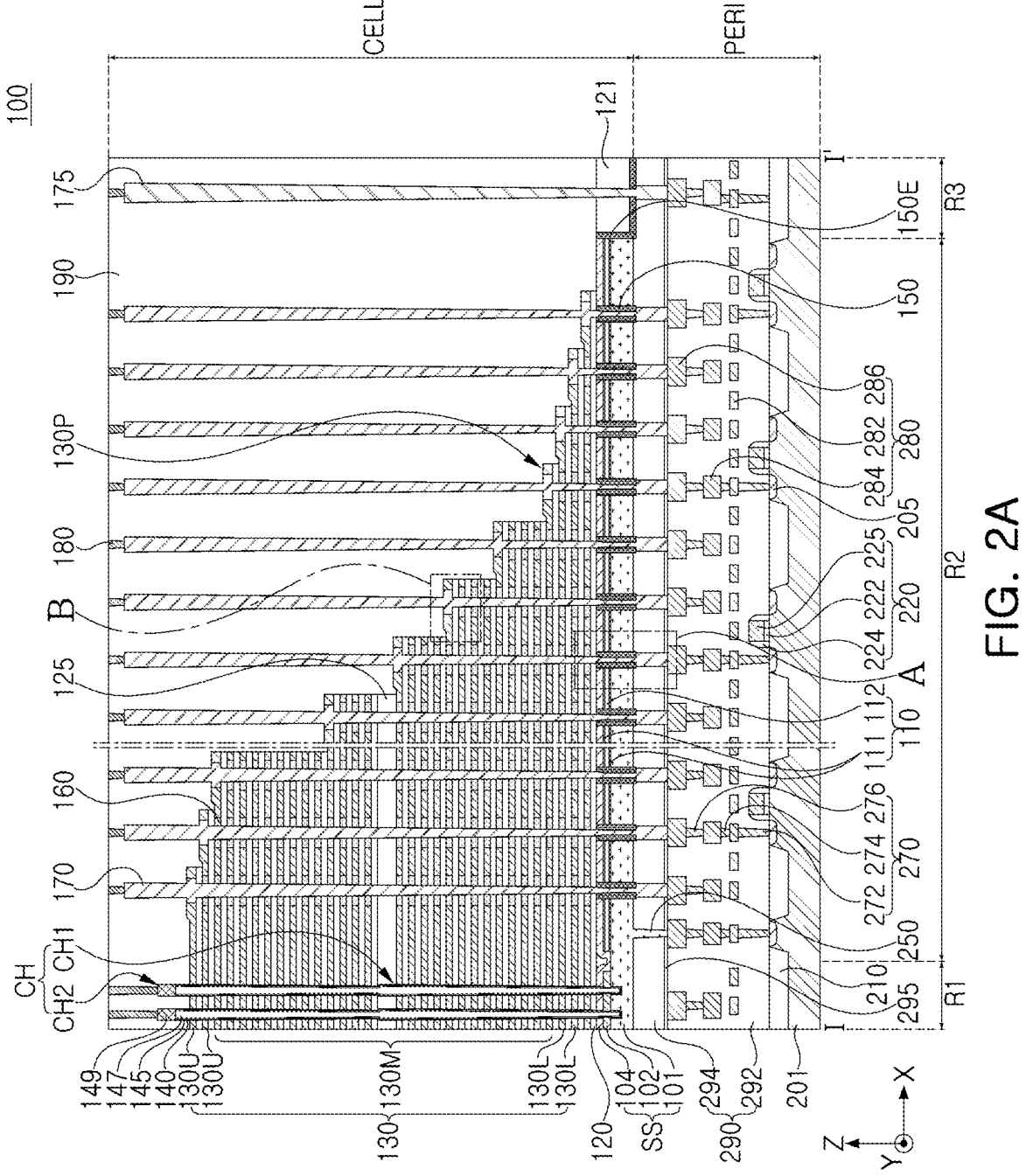
FIGS. 2A and 2B are cross-sectional views illustrating a semiconductor device according to an example embodiment of the present disclosure.
Figure 2B:
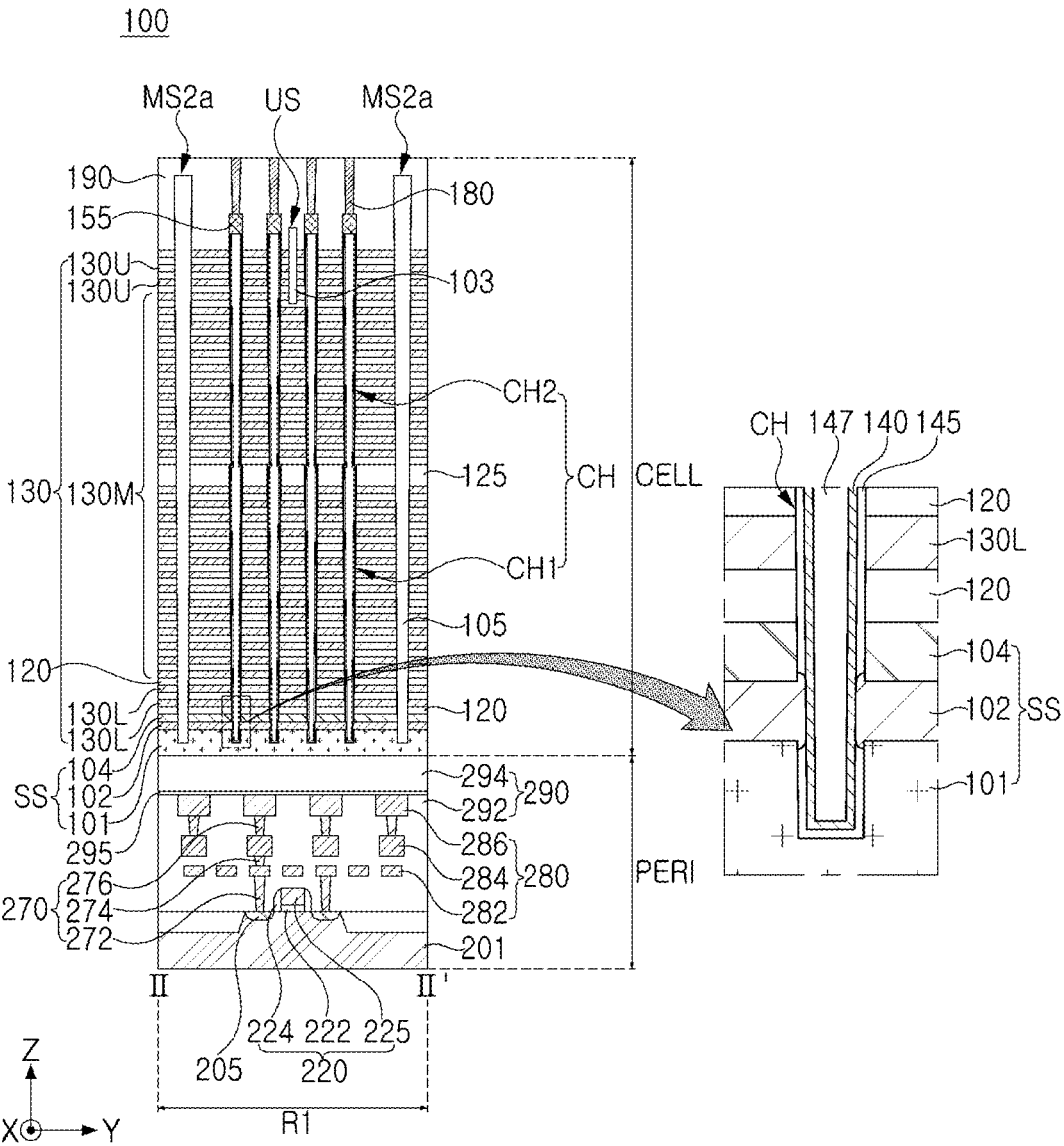

FIGS. 2A and 2B are cross-sectional views illustrating a semiconductor device according to an example embodiment, taken along lines I-I' and II-II' in FIG. 1.

Figure 3A:
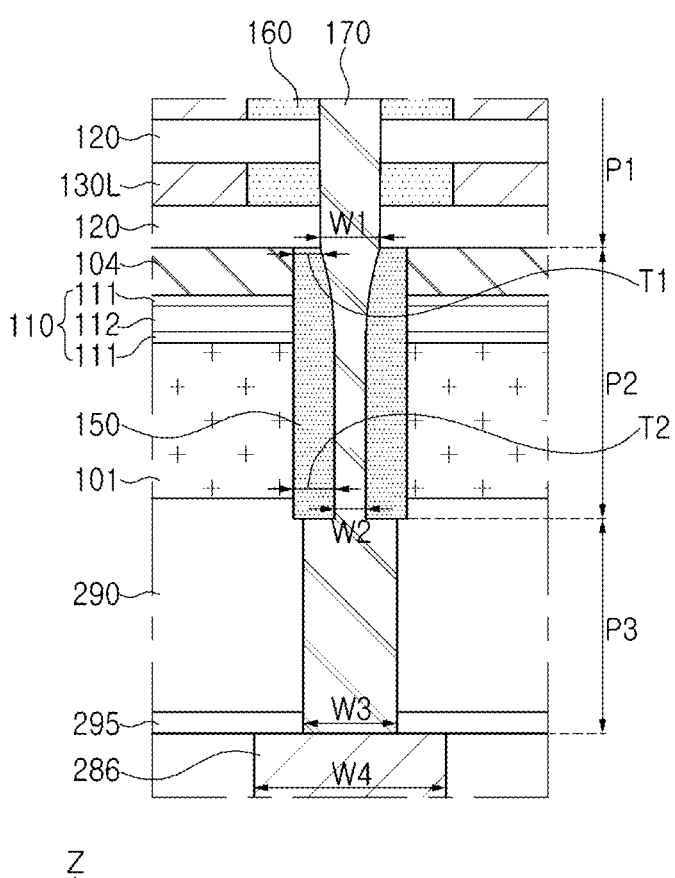
FIGS. 3A and 3B are enlarged views illustrating a portion of a semiconductor device according to an example embodiment of the present disclosure.
Figure 3A:
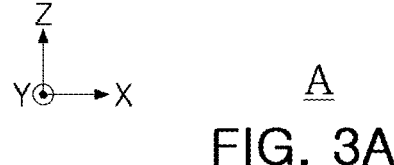
Figure 3B:
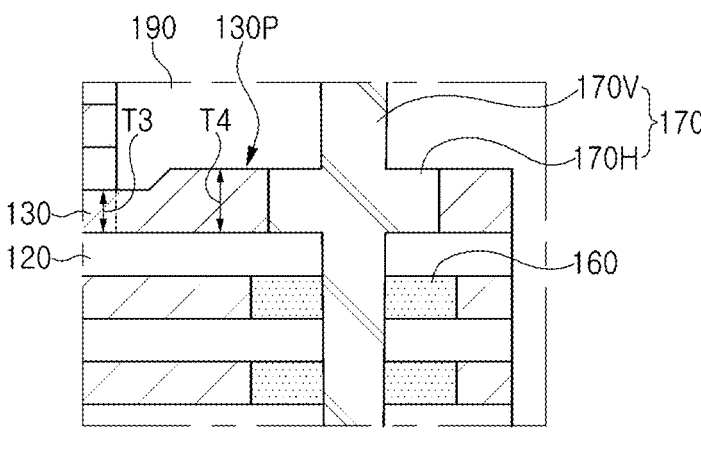
Figure 3B:

FIGS. 3A and 3B are enlarged views illustrating a portion of a semiconductor device according to an example embodiment. FIG. 3A is an enlarged view illustrating region "A" in FIG. 2A, and FIG. 3B is an enlarged view illustrating region "B" in FIG. 2A.

Referring to FIGS. 1 to 3B, the semiconductor device 100 may include a peripheral circuit region PERI which is a first semiconductor structure including a substrate 201 and a cell region CELL which is a second semiconductor structure including a plate layer 101. The memory cell region CELL may be disposed on the peripheral circuit region PERI. Alternately, in some example embodiments, the cell region CELL may be disposed below the peripheral circuit region PERI.

The peripheral circuit region PERI may include a substrate 201, impurity regions 205 and device isolation layers 210 disposed in the substrate 201, circuit devices 220 disposed on the substrate 201, a peripheral region insulating layer 290, a lower protective layer 295, lower contact plugs 270, lower interconnection lines 280, and a ground via 250.

The substrate 201 may have an upper surface extending in the x-direction and the y-direction. An active region may be defined in the substrate 201 by the device isolation layers 210. The impurity regions 205 including impurities may be disposed in a portion of the active region. The substrate 201 may include a semiconductor material, such as, for example, a group IV semiconductor, a group III-V compound semiconductor, or a group II-VI compound semiconductor. The substrate 201 may be provided as a bulk wafer or as an epitaxial layer.

The circuit devices 220 may include a planar transistor. Each of (or alternatively, at least one of) the circuit devices 220 may include a circuit gate dielectric layer 222, a spacer layer 224, and a circuit gate electrode 225. The impurity regions 205 may be disposed in the substrate 201 on both sides of the circuit gate electrode 225 as source/drain regions.

The peripheral region insulating layer 290 may be disposed on the circuit device 220 on the substrate 201. The peripheral region insulating layer 290 may include first and second peripheral region insulating layers 292 and 294, and each of (or alternatively, at least one of) the first and second peripheral region insulating layers 292 and 294 may include a plurality of insulating layers. The peripheral region insulating layer 290 may be formed of an insulating material.

The lower protective layer 295 may be disposed on the upper surface of the uppermost third lower interconnection lines 286 between the first and second peripheral region insulating layers 292 and 294. In some example embodiments, the lower protective layer 295 may be further disposed on the upper surfaces of the first and second lower interconnection lines 282 and 284. The lower protective layer 295 may prevent or hinder contamination of the lower interconnection lines 280 by a metal material disposed therebelow. The lower protective layer 295 may be formed of an insulating material different from that of the peripheral region insulating layer 290, and may include, for example, silicon nitride.

The lower contact plugs 270 and the lower interconnection lines 280 may form a lower interconnection structure electrically connected to the circuit devices 220 and the impurity regions 205. The lower contact plugs 270 may have a cylindrical shape, and the lower interconnection lines 280 may have a line shape. The lower contact plugs 270 may include first to third lower contact plugs 272, 274, and 276. The first lower contact plugs 272 may be disposed on the circuit devices 220 and the impurity regions 205, the second lower contact plugs 274 may be disposed on the first lower interconnection lines 282, and the third lower contact plugs 276 may be disposed on the second lower interconnection lines 284. The lower interconnection lines 280 may include first to third lower interconnection lines 282, 284, and 286. The first lower interconnection lines 282 may be disposed on the first lower contact plugs 272, the second lower interconnection lines 284 may be disposed on the second lower contact plugs 274, and the third lower interconnection lines 286 may be disposed on the third lower contact plugs 276. The lower contact plugs 270 and the lower interconnection lines 280 may include a conductive material, such as, for example, tungsten (W), copper (Cu), and aluminum (Al), and each component may further include a diffusion barrier. However, in some example embodiments, the number of the lower contact plugs 270 and the lower interconnection lines 280 and the arrangement thereof may be varied.

The ground via 250 may be disposed in the peripheral circuit region PERI to electrically connect the substrate 201 to the plate layer 101. The ground via 250 may extend from the lower surface of the plate layer 101 and may be integrated with the plate layer 101. The ground via 250 may be connected to the substrate 201 through a ground interconnection structure including conductive plugs and conductive lines corresponding to the lower interconnection structure. The ground via 250 may form a ground structure together with the ground interconnection structure. The ground structure may perform a function of grounding the plate layer 101 and the second horizontal conductive layer 104 during the process of manufacturing the semiconductor device 100, thereby preventing or hindering arcing.

Only one ground via 250 is illustrated in FIG. 2A, but a plurality of ground vias 250 may be disposed in the semiconductor device 100 with a constant distance therebetween in the y-direction, for example. The ground via 250 may be disposed below the plate layer 101 in the second region R2, but the example embodiments thereof are not limited thereto. The impurity region 205 electrically connected to the ground via 250 may be disposed to be spaced apart from an adjacent region of the active region in which the circuit devices 220 of the peripheral circuit region PERI are disposed. The ground via 250 may include the same semiconductor material as that of the plate layer 101, such as, for example, at least one of silicon (Si) and germanium (Ge), and may further include impurities. However, in some example embodiments, the ground via 250 may not be integrated with the plate layer 101, and may include a material different from that of the plate layer 101.

The memory cell region CELL may have first to third regions R1, R2, and R3, and may include a source structure SS, gate electrodes 130 stacked on the source structure SS, interlayer insulating layers 120 alternately stacked with the gate electrodes 130, channel structures CH disposed to penetrate the stack structure of the gate electrodes 130 in the first region R1, first and second isolation regions MS1, MS2a, and MS2b extending by penetrating through the stack structure of the gate electrodes 130, contact plugs 170 connected to the pad regions 130P of the gate electrodes 130 in the second region R2 and extending vertically, and spacer layers 150 disposed between the contact plugs 170 and the source structure SS.

The memory cell region CELL may include an the external-side insulating layer 150E disposed on an external side of the source structure SS, a substrate insulating layer 121, first and second horizontal conductive layers 102 and 104 disposed below the gate electrodes 130 in the first region R1, a horizontal insulating layer 110 disposed below the gate electrodes 130 together with the second horizontal conductive layer 104 in the second region R2, upper isolation regions US penetrating through a portion of the gate electrodes 130, support structures DCH disposed to penetrate through the stack structure of the gate electrodes 130 in the second region R2, through-vias 175 extending from the memory cell region CELL to the peripheral circuit region PERI, upper contact plugs 180 on the channel structures CH and the contact plugs 170, and a cell region insulating layer 190 covering the gate electrodes 130.

In the memory cell region CELL, the first region R1 may be a region in which the gate electrodes 130 may be vertically stacked and the channel structures CH may be disposed, and the memory cells may be disposed in the first region RE The second region R2 may be a region in which the gate electrodes 130 may extend to have different lengths, and may be a region for electrically connecting the memory cells to the peripheral circuit region PERI, together with the third region R3. The second region R2 may be disposed on at least one end of the first region R1 in at least one direction, that is, for example, the x-direction. The third region R3 may be disposed on an external side of the second region R2 and may be a region in which the source structure SS may not be disposed.

The source structure SS may include a plate layer 101, a first horizontal conductive layer 102, and a second horizontal conductive layer 104 stacked in order in the first region R1. The source structure SS may include the plate layer 101 and the second horizontal conductive layer 104 in the second region R2. However, in some example embodiments, the number of conductive layers included in the source structure SS may be varied.

The plate layer 101 may have a plate shape and may function as at least a portion of a common source line of the semiconductor device 100. The plate layer 101 may have an upper surface extending in the x-direction and the y-direction. The plate layer 101 may include a conductive material. For example, the plate layer 101 may include a semiconductor material, such as a group IV semiconductor, a group III-V compound semiconductor, or a group II-VI compound semiconductor. For example, the group IV semiconductor may include silicon, germanium, or silicon-germanium. The plate layer 101 may further include impurities. The plate layer 101 may be provided as a polycrystalline semiconductor layer such as a polycrystalline silicon layer or an epitaxial layer.

The first and second horizontal conductive layers 102 and 104 may be stacked in order on the upper surface of the plate layer 101 in the first region R1. The first horizontal conductive layer 102 may not extend to the second region R2, and the second horizontal conductive layer 104 may extend to the second region R2. The first horizontal conductive layer 102 may function as a portion of the common source line of the semiconductor device 100, and for example, the first horizontal conductive layer 102 may function as a common source line together with the plate layer 101. As illustrated in the enlarged view in FIG. 2B, the first horizontal conductive layer 102 may be directly connected to the channel layer 140 around the channel layer 140. The second horizontal conductive layer 104 may be in contact with the plate layer 101 in a portion of regions of the second region R2 in which the first horizontal conductive layer 102 and the horizontal insulating layer 110 are not disposed.

The first and second horizontal conductive layers 102 and 104 may include a semiconductor material, such as polycrystalline silicon. In this case, at least the first horizontal conductive layer 102 may be doped with impurities of the same conductivity type as that of the plate layer 101, and the second horizontal conductive layer 104 may be a doped layer or may include impurities diffused from the first horizontal conductive layer 102. However, the material of the second horizontal conductive layer 104 is not limited to the semiconductor material, and may be replaced with an insulating layer.

The horizontal insulating layer 110 may be disposed on the plate layer 101 on the same level as a level of the first horizontal conductive layer 102 in at least a portion of the second region R2. The horizontal insulating layer 110 may include first and second horizontal insulating layers 111 and 112 alternately stacked on the second region R2 of the plate layer 101. The horizontal insulating layer 110 may be layers remaining after a portion of the first horizontal conductive layer 102 is replaced with the first horizontal conductive layer 102 in the process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 120.

The substrate insulating layer 121 may be disposed to penetrate through the plate layer 101, the horizontal insulating layer 110, and the second horizontal conductive layer 104 in the third region R3, and may be disposed on the insulating layer 150E. The substrate insulating layer 121 may be further disposed in the first region R1 and the second region R2, and for example, the substrate insulating layer 121 may be disposed in a region in which the through-vias 175 are additionally disposed. The upper surface of the substrate insulating layer 121 may be coplanar with the upper surface of the source structure SS. The substrate insulating layer 121 may include an insulating material, such as, for example, silicon oxide, silicon nitride, silicon carbide, or silicon oxynitride.

The gate electrodes 130 may be vertically stacked and spaced apart from each other on the plate layer 101 and may form a stack structure together with the interlayer insulating layers 120. The stack structure may include vertically stacked lower and upper stack structures. However, in some example embodiments, the stack structure may be configured as a single stack structure.

The gate electrodes 130 may include lower gate electrodes 130L included in a gate of a ground select transistor, memory gate electrodes 130M included in the plurality of memory cells, and upper gate electrodes 130U included in gates of string select transistors. The number of memory gate electrodes 130M included in the memory cells may be determined depending on capacity of the semiconductor device 100. In some example embodiments, the number of the upper and lower gate electrodes 130U and 130L may be 1 to 4 or more, and may have a structure the same as or different from the memory gate electrodes 130M. In some example embodiments, the gate electrodes 130 may further include a gate electrode 130 disposed below the upper gate electrodes 130U and/or lower gate electrodes 130L of the upper gate electrodes 130U and included in an erase transistor used for an erase operation using a gate induced drain leakage (GIDL) phenomenon. Also, a portion of the gate electrodes 130, that is, for example, the memory gate electrodes 130M adjacent to the upper or lower gate electrodes 130U and 130L, may be dummy gate electrodes.

As illustrated in FIG. 1, the gate electrodes 130 may be isolated from each other in the y-direction by the first isolation regions MS1 continuously extending from the first region R1 and the second region R2. The gate electrodes 130 between a pair of first isolation regions MS1 may form a single memory block, but the scope of the memory block is not limited thereto. A portion of the gate electrodes 130, that is, for example, the memory gate electrodes 130M, may form a layer in a memory block.

The gate electrodes 130 may be vertically stacked and spaced apart from each other on the first region R1 and the second region R2, may extend by different lengths from the first region R1 to the second region R2 and may form a step structure in the form of a staircase in portion of the second region R2. The gate electrodes 130 may be disposed to have a step structure in the y-direction as well. Due to the step structure, in the gate electrodes 130, the lower gate electrode 130 may extend longer than the upper gate electrode 130, such that the gate electrodes 130 may have regions in which uppers surfaces may be exposed upwardly from the interlayer insulating layers 120 and the other gate electrodes 130, and the regions may be referred to as pad regions 130P. In each gate electrode 130, the pad region 130P may be a region including the end of the gate electrode 130 in the x-direction. The gate electrodes 130 may connected to the contact plugs 170 in the pad regions 130P, be respectively. The gate electrodes 130 may have an increased thickness in the pad regions 130P.

The gate electrodes 130 may include a metal material, such as, for example, tungsten (W). In some example embodiments, the gate electrodes 130 may include polycrystalline silicon or a metal silicide material. In some example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may be spaced apart from each other in a direction perpendicular or substantially perpendicular to the upper surface of the plate layer 101 and may extend in the x-direction. The interlayer insulating layers 120 may include an insulating material such as silicon oxide or silicon nitride.

Each of (or alternatively, at least one of) the channel structures CH may form a memory cell string, and may be spaced apart from each other while forming rows and columns on the plate layer 101 in the first region R1. The channel structures CH may be disposed to form a grid pattern or may be disposed in a zigzag pattern in one direction on the x-y plane. The channel structures CH may have a columnar shape, and may have inclined side surfaces of which a width may decrease toward the plate layer 101 depending on an aspect ratio. In some example embodiments, at least a portion of the channel structures CH disposed on the end of the first region R1 may be dummy channels.

The channel structures CH may include vertically stacked first and second channel structures CH1 and CH2. The channel structures CH may have a form in which the lower first channel structures CH1 and the upper second channel structures CH2 are connected to each other, and may have a bent portion due to a difference in width in the connection region. However, in some example embodiments, the number of channel structures stacked in the z-direction may be varied.

Each of (or alternatively, at least one of) the channel structures CH may include a channel layer 140, a gate dielectric layer 145, a channel filling insulating layer 147, and a channel pad 149 disposed in the channel hole. As illustrated in the enlarged view in FIG. 2B, the channel layer 140 may be formed in an annular shape surrounding the channel filling insulating layer 147 therein, but in some example embodiments, the channel layer 140 may have a columnar shape such as a cylindrical shape or a prism shape without the channel filling insulating layer 147. The channel layer 140 may be connected to the first horizontal conductive layer 102 in a lower portion. The channel layer 140 may include a semiconductor material such as polycrystalline silicon or single crystal silicon.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130.

The channel pad 149 may be disposed only on the upper end of the upper second channel structure CH2. The channel pad 149 may include, for example, doped polycrystalline silicon.

The channel layer 140, the gate dielectric layer 145, and the channel filling insulating layer 147 may be connected to each other between the first channel structure CH1 and the second channel structure CH2. Upper interlayer insulating layer 125 having a relatively great thickness may be disposed between the first channel structure CH1 and the second channel structure CH2. However, the thicknesses and shapes of the interlayer insulating layers 120 and the upper interlayer insulating layer 125 may be varied in some example embodiments.

The support structures DCH may be disposed to be spaced apart from each other while forming rows and columns on the plate layer 101 in the second region R2. As illustrated in FIG. 1, the support structures DCH may be disposed to surround the contact plugs 170 in four directions, respectively. However, in some example embodiments, the arrangement of the support structures DCH may be varied. The support structures DCH may have a columnar shape, and may have inclined side surfaces of which a width may decrease toward the plate layer 101 depending on an aspect ratio.

The support structures DCH may have a circular shape, an elliptical shape, or a shape similar thereof on the x-y plane. A diameter or a maximum width of the support structures DCH may be greater than that of the channel structures CH, but the example embodiments thereof are not limited thereto. The support structures DCH may have an internal structure the same as or different from the channel structures CH. For example, the support structures DCH may not include a conductive layer and may include an insulating material such as silicon oxide, silicon nitride, or silicon oxynitride.

The first and second isolation regions MS1, MS2*a*, and MS2*b* may be disposed to penetrate through the gate electrodes 130 and to extend in the x-direction. The first and second isolation regions MS1, MS2*a*, and MS2*b* may be disposed parallel or substantially parallel to each other. The first and second isolation regions MS1, MS2*a*, and MS2*b* may penetrate the entirety of the gate electrodes 130 stacked on the plate layer 101, and may further penetrate the first and second horizontal conductive layers 102 and 104 and the horizontal insulating layer 110 therebelow and may be connected to the plate layer 101. The first isolation regions MS1 may extend as a single layer in the x-direction, and the second isolation regions MS2*a* and MS2*b* may intermittently extend between a pair of first isolation regions MS1 or may be disposed only in a portion of regions. For example, the second central isolation regions MS2*a* may extend as a single region in the first region R1 and may intermittently extend in the x-direction in the second region R2. The second auxiliary isolation regions MS2*b* may be disposed only in the second region R2 and may intermittently extend in the x-direction. However, in some example embodiments, the arrangement order of the first and second isolation regions MS1, MS2*a*, and MS2*b* and the number of the first and second isolation regions MS1, MS2*a*, and MS2*b* are not limited to the example illustrated in FIG. 1.

An isolation insulating layer 105 may be disposed in the first and second isolation regions MS1, MS2*a*, and MS2*b*. The isolation insulating layer 105 may have a shape in which a width may decrease toward the plate layer 101 due to a high aspect ratio, but the example embodiments thereof are not limited thereto, and the isolation insulating layer 105 may have a side surface perpendicular or substantially perpendicular to the upper surface of the plate layer 101. The isolation insulating layer 105 may include an insulating material, such as, for example, silicon oxide, silicon nitride, or silicon oxynitride.

As illustrated in FIG. 1, the upper isolation regions US may extend in the x-direction between the first isolation regions MS1 and the second central isolation region MS2*a* and between the second central isolation regions MS2*a* in the first region R1. The upper isolation regions US may be disposed in a portion of the second region R2 and in the first region R1 to penetrate a portion of the gate electrodes 130 including the uppermost upper gate electrode 130U among the gate electrodes 130. As illustrated in FIG. 2B, the upper isolation regions US may isolate, for example, three gate electrodes 130 from each other in the y-direction. However, the number of gate electrodes 130 isolated by the upper isolation regions US may be varied in some example embodiments. The upper isolation regions US may include an upper isolation insulating layer 103. The upper isolation insulating layer 103 may include an insulating material, such as, for example, silicon oxide, silicon nitride, or silicon oxynitride.

The contact plugs 170 may be connected to the pad regions 130P of the uppermost gate electrodes 130 in the second region R2. The contact plugs 170 may penetrate through at least a portion of the cell region insulating layer 190 and may be connected to the pad regions 130P of the gate electrodes 130 exposed upwardly, respectively. The contact plugs 170 may penetrate the gate electrodes 130 below the pad regions 130P, may penetrate the horizontal insulating layer 110, the second horizontal conductive layer 104, and the plate layer 101, and may be connected to the lower interconnection lines 280 in the peripheral circuit region PERI. The contact plugs 170 may be spaced apart from the gate electrodes 130 disposed below the pad regions 130P by the contact insulating layers 160. The contact plugs 170 may be spaced apart from the plate layer 101, the horizontal insulating layer 110, and the second horizontal conductive layer 104 by the spacer layers 150.

As illustrated in FIG. 3A, each of (or alternatively, at least one of) the contact plugs 170 may include a first portion P1 on the source structure SS, a second portion P2 surrounded by spacer layers 150, and a third portion P3 disposed below the spacer layers 150.

The side surface of the first portion P1 may be surrounded by the cell region insulating layer 190, the interlayer insulating layers 120, and the contact insulating layers 160. The first portion P1 may have a cylindrical shape in which a width may decrease toward the plate layer 101 due to an aspect ratio. The first portion P1 may have a substantially constant inclination.

A side surface of the second portion P2 may be surrounded by the spacer layers 150. The second portion P2 may have a shape in which a width may decrease downwardly. At least a portion of the side surface of the second portion P2 may have an inclination different from that of the side surface of the first portion P1, and may have a shape discontinuous from the first portion P1. The second portion P2 may have a non-uniform inclination such that the second portion P2 may include a region in which a width may not uniformly decrease, and for example, the second portion P2 may include a region in which a width may non-linearly decrease. The second portion P2 may include a region having a curved side surface, and may include a region in which a width may decrease more rapidly or gently than the inclination of the side surface of the first portion P1.

The third portion P3 may have a side surface surrounded by the peripheral region insulating layer 290 and the upper protective layer 295. The third portion P3 may be disposed below the spacer layer 150 and may be in contact with a lower surface of the spacer layer 150. A lower surface of the third portion P3 may be connected to an uppermost third lower interconnection line 286 among the lower interconnection lines 280. The third portion P3 may be disposed on substantially the same level as a level of the ground via 250. Alternatively, the third portion P3 may be disposed to overlap the ground via 250 in at least the x-direction. In some example embodiments, the third portion P3 may partially recess an upper surface of the third lower interconnection line 286. The third lower interconnection line 286 connected to the third portion P3 may have an island shape on a plane and may be spaced apart from the adjacent third lower interconnection line 286, but the example embodiments thereof are not limited thereto. The third portion P3 may have an increased width as compared to the second portion P2 and may extend downwardly at a substantially constant inclination. The side surface of the third portion P3 may extend discontinuously to an external side from the side surface of the second portion P2, and may include a region extending horizontally in the x-direction and the y-direction at a boundary with the second portion P2.

A width or diameter of each of (or alternatively, at least one of) the first to third portions P1, P2, and P3 may be greater in an upper portion than in a lower portion. The first portion P1 may have a first width W1, the second portion P2 may have a second width W2 smaller than the first width W1, and the third portion P3 may have a third width W3 greater than the second width W2. The third width W3 may be greater than the first width W1. The first to third widths W1, W2, and W3 may refer to a width or diameter on a lower end or at one point in lower portion of each of (or alternatively, at least one of) the first to third portions P1, P2 and P3, or may refer to a minimum width or diameter. For example, the first width W1 may be the width on the level of the upper surface of the second horizontal conductive layer 104, the second width W2 may be the width on the level of the lower surface of the plate layer 101, and the third width W3 may be the width on the level of the lower surface of the third portion P3. The third width W3 may be smaller than the fourth width W4 of the third lower interconnection line 286 connected to the third portion P3.

In FIG. 3A, the entirety of the second portion P2 may have a width smaller than that of the first portion P1. However, the width of the second portion P2 in the region connected to the first portion P1 is not limited thereto. In some example embodiments, the second portion P2 may have a width greater than that of the lower portion of the first portion P1 in the upper portion connected to the first portion P1.

As illustrated in FIG. 3B, each of (or alternatively, at least one of) the contact plugs 170 may include a vertical extension portion 170V extending in the z-direction, and a horizontal extension portion 170H extending horizontally from the vertical extension portion 170V and in contact with the pad regions 130P. The horizontal extension portion 170H may be disposed along the circumference of the vertical extension portion 170V, and a length from the side surface of the vertical extension portion 170V to the other end may be shorter than the length of the lower contact insulating layers 160. The gate electrode 130 may extend from the first region R1 toward the second region R2 by a third thickness T3, and may have a fourth thickness T4 greater than the third thickness T3. The horizontal extension portion 170H may be in contact with a region in which the gate electrode 130 has a fourth thickness T4.

The contact plugs 170 may include a conductive material, such as, for example, at least one of tungsten (W), copper (Cu), aluminum (Al), or an alloy thereof. The first to third portions P1, P2, and P3 may be integrally formed and may be formed as a single layer. In some example embodiments, the contact plugs 170 may include a barrier layer extending along side surfaces and a bottom surface, or may have an air gap therein.

The spacer layers 150 may be disposed in the second region R2, and may surround side surfaces of the second portions P2 of each of (or alternatively, at least one of) the contact plugs 170. The spacer layers 150 may be interposed between the contact plugs 170 and each of (or alternatively, at least one of) the second horizontal conductive layer 104, the horizontal insulating layer 110, and the plate layer 101 and may isolate the contact plugs 170 from the second horizontal conductive layer 104, the horizontal insulating layer 110, and the plate layer 101. The level of upper ends or upper surfaces of the spacer layers 150 may be substantially the same as or lower than the level of the upper surface of the second horizontal conductive layer 104. The level of the lower surfaces of the spacer layers 150 may be lower than the level of the lower surface of the plate layer 101. Accordingly, a portion of the side surface and a portion of the lower surface may be in contact with the peripheral region insulating layer 290.

As illustrated in FIG. 3A, each of (or alternatively, at least one of) the spacer layers 150 may surround the second portion P2, and may have an asymmetric shape in which upper and lower portions are asymmetric with respect to the center in the z-direction. In the spacer layer 150, the width or thickness T1 on the upper surface or the upper portion may be smaller than the width or thickness T2 on the lower surface or the lower portion. The thickness T2 may range, for example, from about 100 nm to about 250 nm. The spacer layer 150 may include a region curved outwardly or inwardly toward the contact plug 170.

The spacer layers 150 may include an insulating material, and may include an insulating material different from an insulating material of the peripheral region insulating layer 290, the substrate insulating layer 121, and the interlayer insulating layers 120. For example, the spacer layers 150 may include at least one of silicon carbide (SiC), silicon oxycarbide (SiOC), silicon carbonitride (SiCN), or silicon oxynitride carbide (SiOCN).

The spacer layers 150 may allow the contact plugs 170 to self-align in an inner region of the spacer layers 150 during the process of manufacturing the semiconductor device 100, thereby controlling the shape of the contact plugs 170 at the bottom surface. Accordingly, a defect occurring when the shape of the lower ends of the contact plugs 170 is irregular, which will be described in greater detail with reference to FIG. 8G below.

The external-side insulating layer 150E may extend vertically along external side surfaces of the plate layer 101, the second horizontal conductive layer 104, and the horizontal insulating layer 110, and may horizontally extend along an upper surface of the second peripheral region insulating layer 294. The external-side insulating layer 150E may be a layer formed during a process of forming the spacer layers 150, and may be formed of the same material as a material of the spacer layers 150. The external-side insulating layer 150E may be disposed on substantially the same level as a level of the spacer layers 150.

The through-via 175 may be disposed on an external side of the source structure SS, such as, for example, the plate layer 101, and may penetrate through the memory cell region CELL and may extend to the peripheral circuit region PERI. The through-via 175 may be disposed to connect the upper contact plugs 180 of the memory cell region CELL to the lower interconnection lines 280 of the peripheral circuit region PERI. The through-via 175 may penetrate through the cell region insulating layer 190, the substrate insulating layer 121, the external-side insulating layer 150E, and the second peripheral region insulating layer 294. However, in some example embodiments, the through-via 175 may be disposed to penetrate through the stack structure of the sacrificial insulating layers 118 (see FIG. 8F) and the interlayer insulating layers 120 in a region in which the sacrificial insulating layers 118 may not be replaced with the gate electrodes 130. The through-via 175 may be disposed on substantially the same level as a level of the contact plugs 170, but the example embodiments thereof are not limited thereto.

The through-via 175 may have a shape different from that of the contact plugs 170. The through-via 175 may have a shape in which an inclination of a side surface up to a level corresponding to the lower surface of the external-side insulating layer 150E may be constant, and may have a shape in which a width below the external-side insulating layer 150E may increase discontinuously. For example, the through-via 175 may have an upper region corresponding to the levels of the first and second portions P1 and P2 of the contact plug 170 and a lower region corresponding to the level of the third portion P3 of the contact plug 170. The upper region may have an inclined side surface such that width may continuously decrease, and the lower region may have a shape corresponding to the third portion P3 of the contact plug 170. On a level on which the plate layer 101 and the spacer layers 150 are disposed, the width of the through-via 175 may be greater than the width of the second portion P2 of the contact plug 170. In some example embodiments, the through-via 175 may be disposed such that the upper region may extend to the third lower interconnection line 286 without the lower region.

The through-via 175 may be deposited in the same process as the process of forming the contact plugs 170 and may include the same material as a material of the contact plugs 170. The through-via 175 may include a conductive material, such as, for example, at least one of tungsten (W), copper (Cu), aluminum (Al), or an alloy thereof.

The upper contact plugs 180 may be included in a cell interconnection structure electrically connected to the memory cells in the memory cell region CELL. The upper contact plugs 180 may be connected to the channel structures CH, the contact plugs 170, and the through-via 175, and may be electrically connected to the channel structures CH and the gate electrodes 130. The upper contact plugs 180 may be illustrated in the form of a plug, but the example embodiments thereof are not limited thereto, and the upper contact plugs 180 may have a line form. In some example embodiments, the number of plugs and interconnection lines included in the cell interconnection structure may be varied. The upper contact plugs 180 may include a metal, such as, for example, tungsten (W), copper (Cu), aluminum (Al), or the like.

The cell region insulating layer 190 may be disposed to cover the stack structure of the gate electrodes 130, the contact plugs 170, and the substrate insulating layer 121. The cell region insulating layer 190 may be formed of an insulating material, or may include a plurality of insulating layers.

Figure 4A:
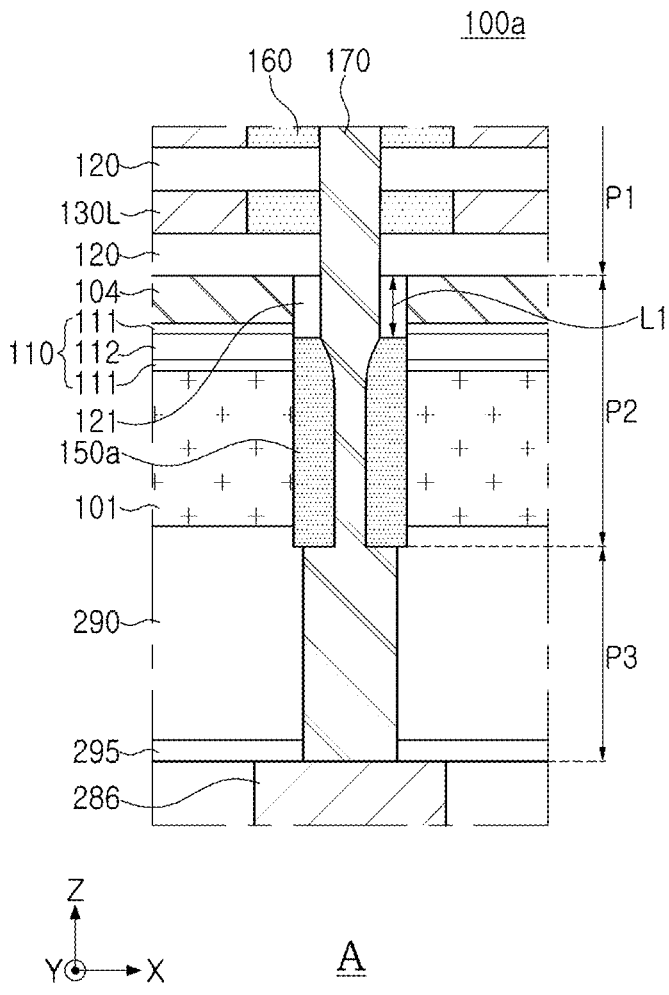
FIGS. 4A to 4C are enlarged views illustrating a portion of a semiconductor device according to an example embodiment of the present disclosure.
Figure 4B:
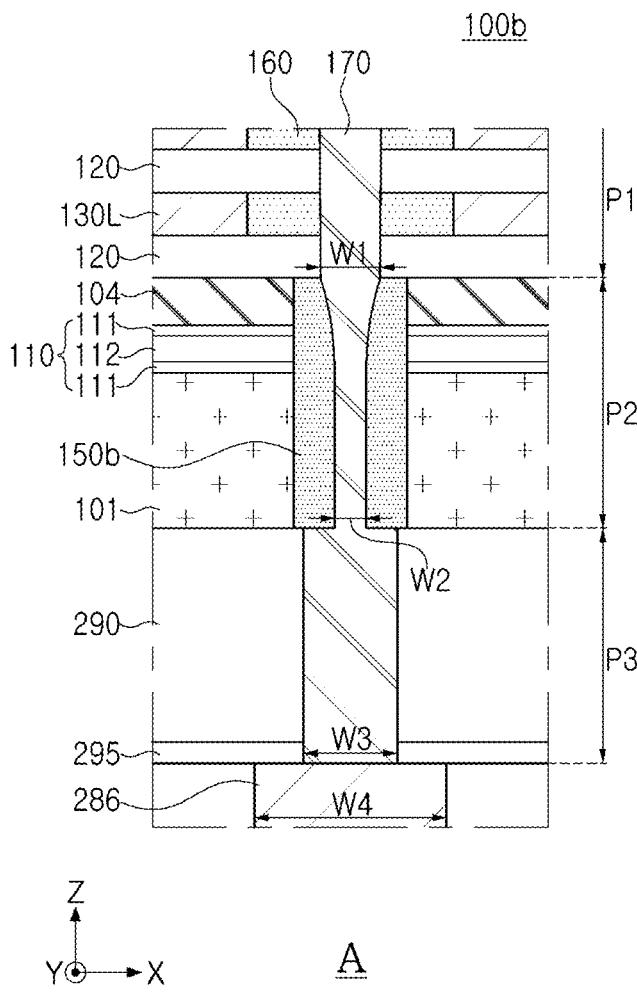
Figure 4C:
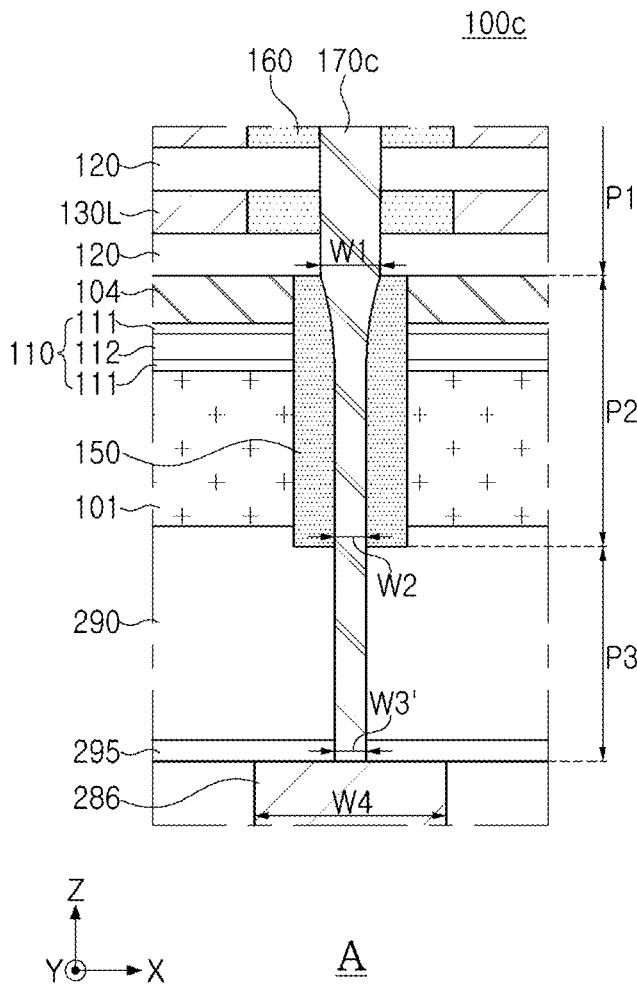

FIGS. 4A to 4C are enlarged views illustrating a portion of a semiconductor device according to an example embodiment, illustrating regions corresponding to FIG. 3A, respectively.

Referring to FIG. 4A, in the semiconductor device 100a, the upper surface of the spacer layer 150a may be disposed on a lever lower than a level of the upper surface of the source structure SS, that is, for example, the second horizontal conductive layer 104. The upper surface of the spacer layer 150a may be disposed on the level of the horizontal insulating layer 110, but the example embodiments thereof are not limited thereto. For example, the upper surface of the spacer layer 150a may be disposed on the level of the plate layer 101. The length L1 of the distance between the upper surface of the spacer layer 150a and the upper surface of the second horizontal conductive layer 104 in the z-direction may be varied in some example embodiments. In some example embodiments, a substrate insulating layer 121 may be disposed on the spacer layer 150a to surround the contact plug 170.

Referring to FIG. 4B, in the semiconductor device 100b, the lower surface of the spacer layer 150b may be disposed on substantially the same level as a level of the lower surface of the source structure SS, that is, for example, a level of the lower surface of the plate layer 101. Accordingly, the level of the lower end of the second portion P2 may also be relatively higher than in some example embodiments in FIGS. 2A and 3A. The level of the upper surface of the third portion P3 may be substantially on the same level as a level of the lower surface of the plate layer 101. Also in some example embodiments, the description described above with reference to FIG. 3A may be applied to the first to fourth widths W1, W2, W3, and W4.

Referring to FIG. 4C, in the semiconductor device 100c, the third portion P3 of the contact plug 170 may have a shape in which the side surface continuously extends from the second portion P2 without a sudden change in width. Specifically, differently from the example embodiment in FIGS. 2A and 3A, the width may not be discontinuously changed at the boundary between the second portion P2 and the third portion P3. Accordingly, the third portion P3 may have a relatively narrow width. In some example embodiments, the third width W3' of the third portion P3 may be equal to or smaller than the second width W2. Otherwise, the description of the first to fourth widths W1, W2, W3, and W4 described above with reference to FIG. 3A may be applied to the other components.

Figure 5A:
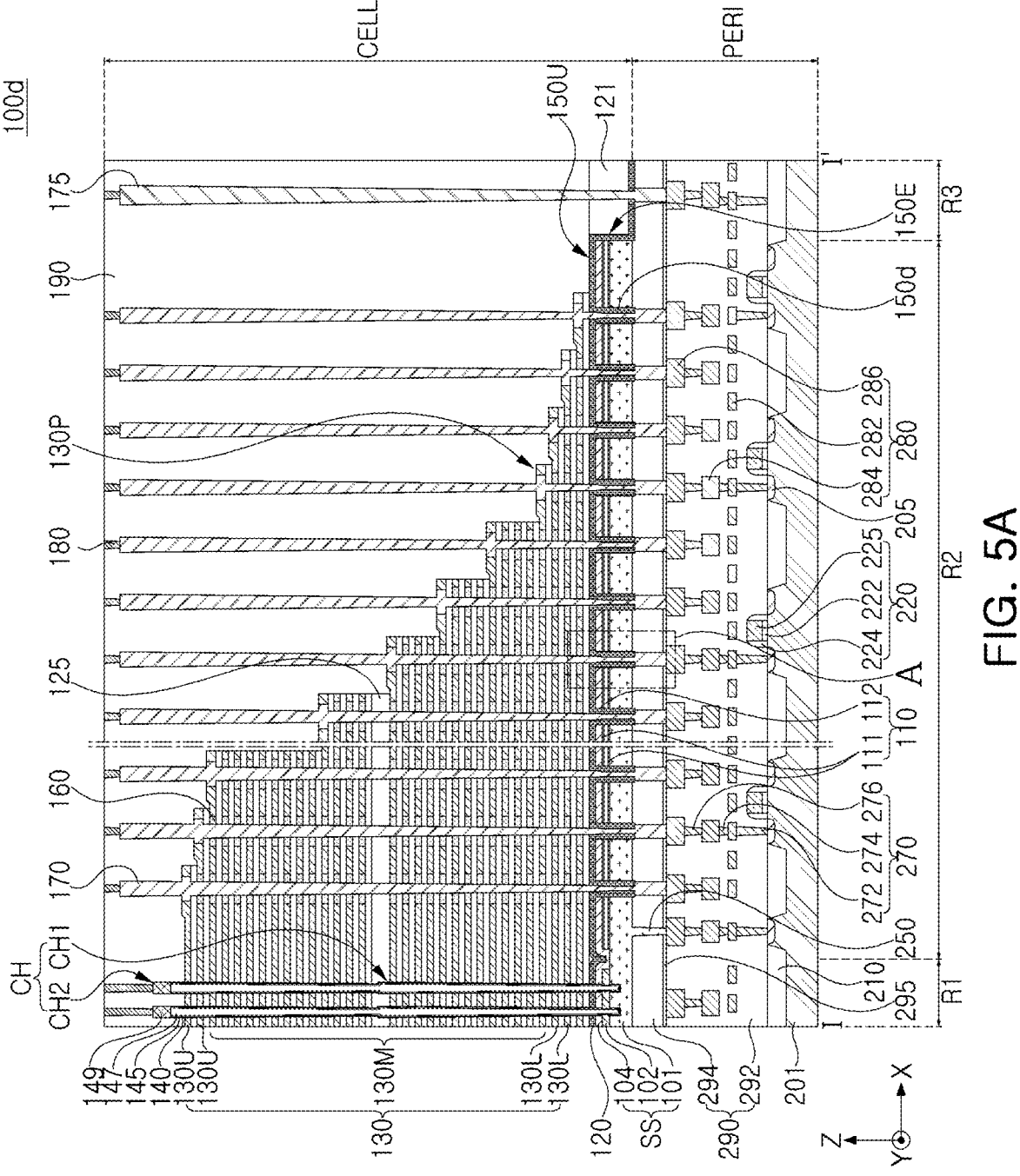
FIGS. 5A and 5B are cross-sectional views illustrating a semiconductor device and an enlarged view illustrating a portion of a semiconductor device according to an example embodiment of the present disclosure.
Figure 5B:
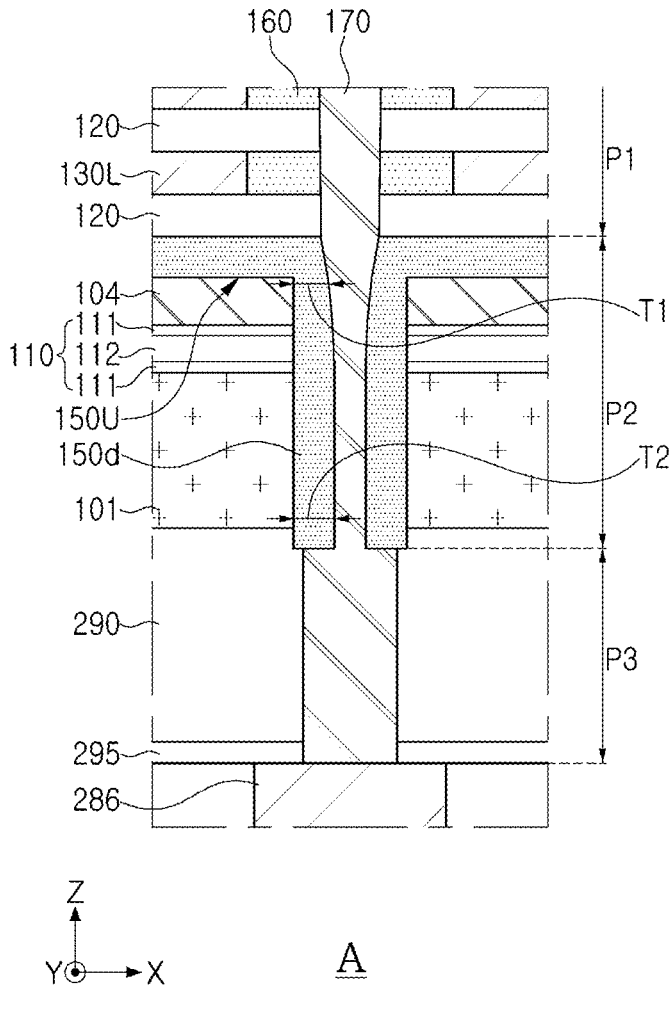

FIGS. 5A and 5B are cross-sectional views illustrating a semiconductor device and an enlarged view illustrating a portion of a semiconductor device according to an example embodiment. FIG. 5A illustrates a region corresponding to FIG. 2A, and FIG. 5B illustrates a region corresponding to FIG. 3A.

Referring to FIGS. 5A and 5B, in the semiconductor device 100d, the spacer layer 150d may extend to the upper surface of the second horizontal conductive layer 104 of the source structure SS, and may include an upper insulating layer region 150U disposed on the upper surface of the conductive layer 104. The upper insulating layer region 150U may be in contact with the interlayer insulating layer 120 and may extend horizontally. The upper surface of the upper insulating layer region 150U may be disposed on substantially the same level as a level of the upper surface of the substrate insulating layer 121. The spacer layer 150d may further include an external-side insulating layer region 150E on an external side of the source structure SS. In some example embodiments, the spacer layer 150d may include the external-side insulating layer region 150E and the upper insulating layer region 150U, and the entirety of the components may be disposed as a single layer.

As illustrated in FIG. 5B, the second portion P2 of the contact plug 170 may be a region surrounded by the spacer layer 150d, and a level of the upper surface of the second portion P2 may be higher than in the example in FIGS. 2A and 3A. The second portion P2 may include, in an upper portion thereof, a region of which an inclination may rapidly change. In the spacer layer 150d, a thickness T1 between the second horizontal conductive layer 104 and the contact plug 170 may be smaller than a thickness T2 between the plate layer 101 and the contact plug 170 therebelow.

Figure 6A:
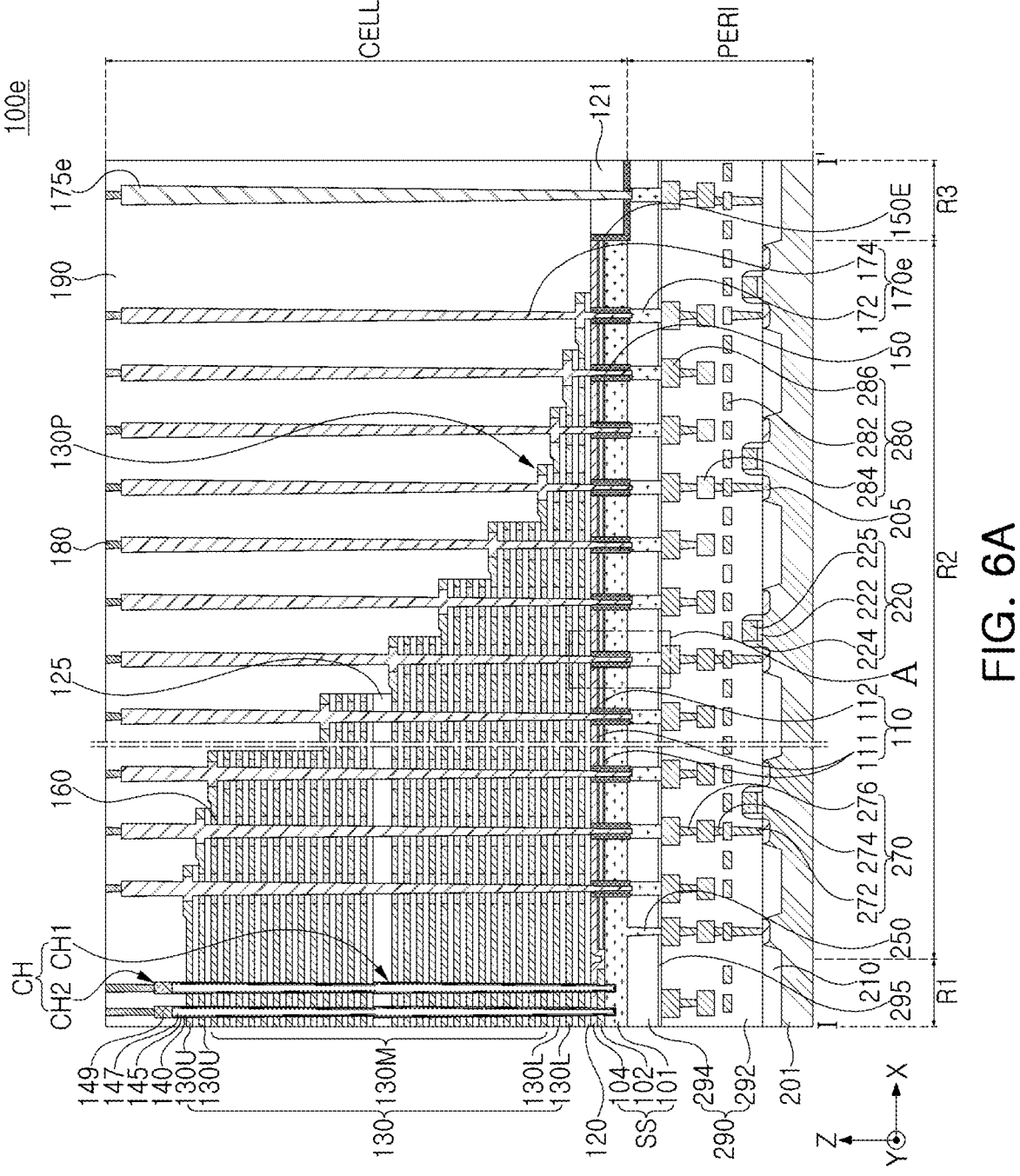
FIGS. 6A and 6B are cross-sectional views illustrating a semiconductor device and an enlarged view illustrating a portion of a semiconductor device according to an example embodiment of the present disclosure.
Figure 6B:
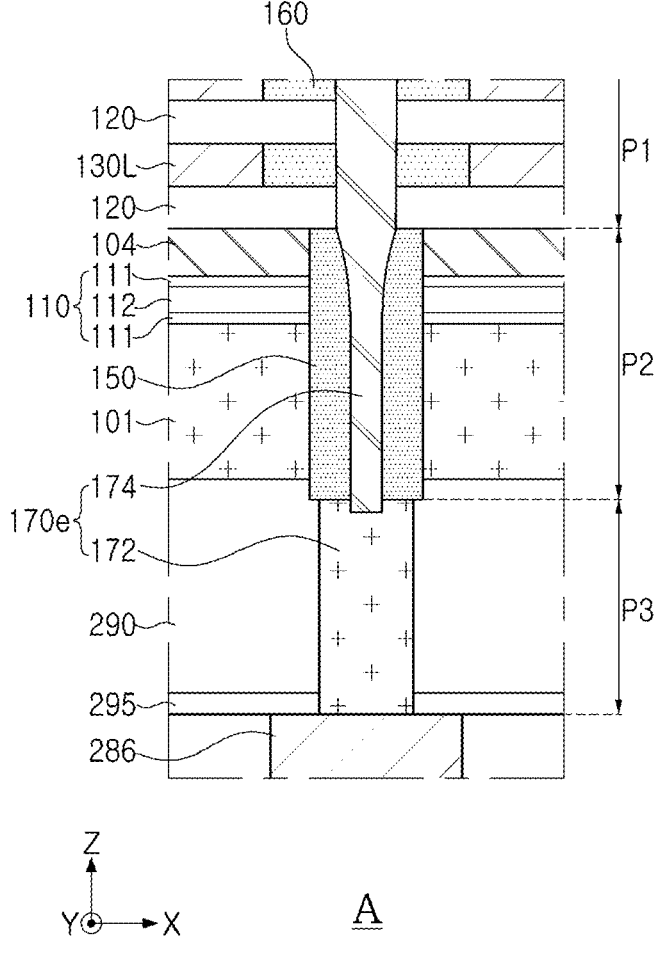

FIGS. 6A and 6B are cross-sectional views illustrating a semiconductor device and an enlarged view illustrating a portion of a semiconductor device according to an example embodiment. FIG. 6A illustrates a region corresponding to FIG. 2A, and FIG. 6B illustrates a region corresponding to FIG. 3A.

Referring to FIGS. 6A and 6B, in the semiconductor device 100e, the contact plugs 170e may include first and second contact layers 172 and 174. The first contact layer 172 may correspond to the third portion P3, and the second contact layer 174 may correspond to the first and second portions P1 and P2. The first contact layer 172 may include a material different from that of the second contact layer 174. As illustrated in FIG. 6B, the second contact layer 174 may have a shape of being partially recessed into an upper portion of the first contact layer 172. The first contact layer 172 may include the same material as that of the plate layer 101 and the ground via 250. For example, when the first contact layer 172 includes a semiconductor material and the second contact layer 174 includes a metal material, metal-semiconductor compound layer, such as, for example, a metal silicide layer may be further disposed on an interfacial surface between the first contact layer 172 and the second contact layer 174.

In some example embodiments, similarly to the contact plugs 170e, a lower region of the through-via 175e corresponding to the lower third portion P3 and an upper region of the through-via 175e may include different materials.

Figure 7:
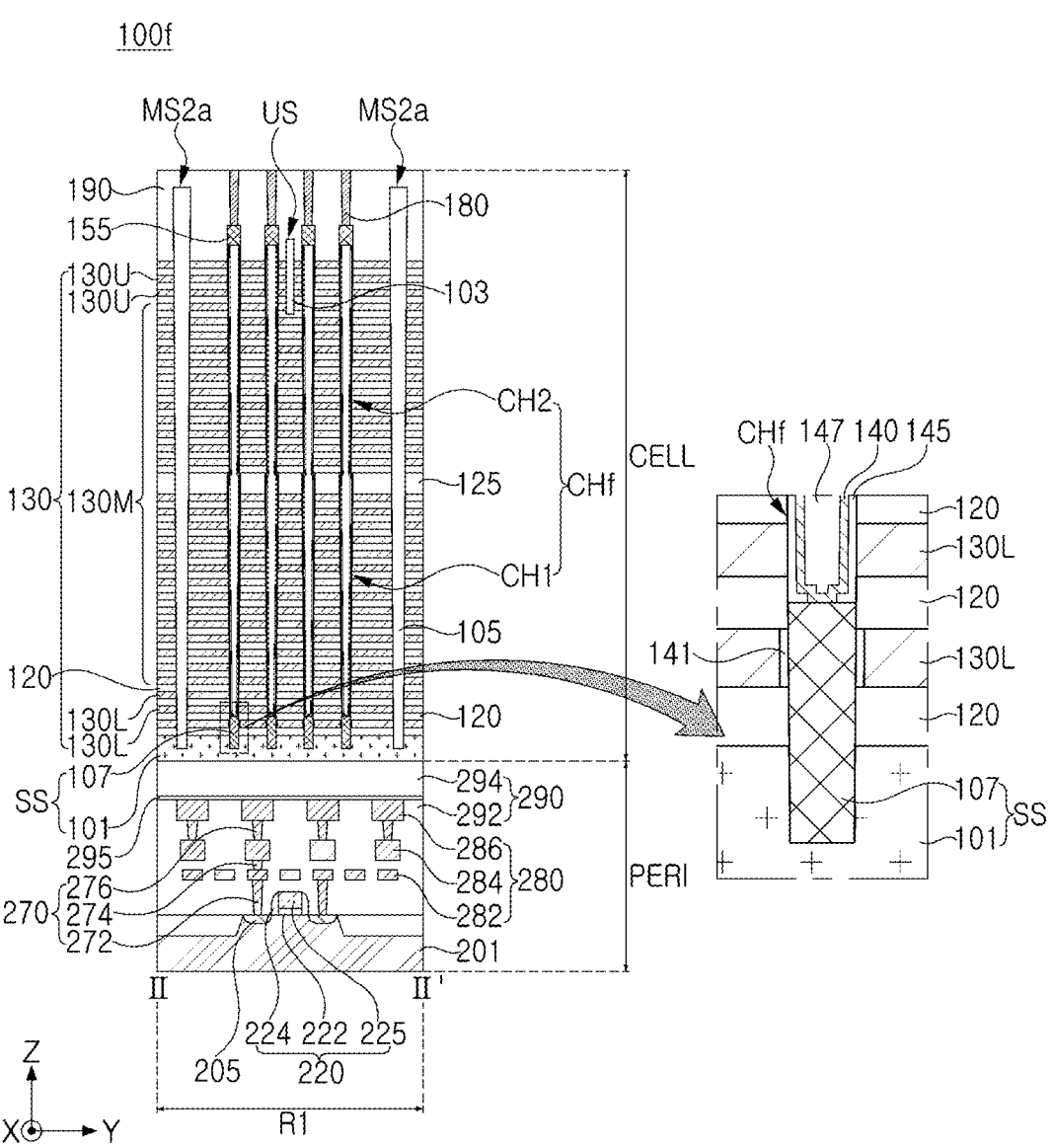
FIG. 7 is a cross-sectional view illustrating a semiconductor device according to an example embodiment of the present disclosure.

FIG. 7 is a cross-sectional view illustrating a semiconductor device according to an example embodiment, illustrating a region corresponding to FIG. 2B.

Referring to FIG. 7, in the semiconductor device 100f, the memory cell region CELL may not include first and second horizontal conductive layers 102 and 104 disposed on the plate layer 101, differently from the example embodiment in FIGS. 2A and 2B. Also, each of (or alternatively, at least one of) the channel structures CHf may further include an epitaxial layer 107.

The epitaxial layer 107 may be disposed on the plate layer 101 on the lower end of the channel structure CHf, and may form the source structure SS together with the plate layer 101. The epitaxial layer 107 may be disposed on a side surface of the at least one lower gate electrode 130L. The epitaxial layer 107 may be disposed in a region in which the plate layer 101 is recessed. A level of the lower surface of the epitaxial layer 107 may be higher than a level of the upper surface of the lowermost lower gate electrode 130L and may be lower than a level of the lower surface of the upper lower gate electrode 130L, but the example embodiments thereof are not limited thereto. The epitaxial layer 107 may be connected to the channel layer 140 through the upper surface. A gate insulating layer 141 may be further disposed between the epitaxial layer 107 and the lower gate electrode 130L in contact with the epitaxial layer 107.

Such a shape of the channel structure CHf may be applicable to other example embodiments.

FIGS. 8A to 8K are cross-sectional views illustrating a method of manufacturing a semiconductor device according to an example embodiment, sectional views corresponding to FIG. 2A.

Figure 8A:
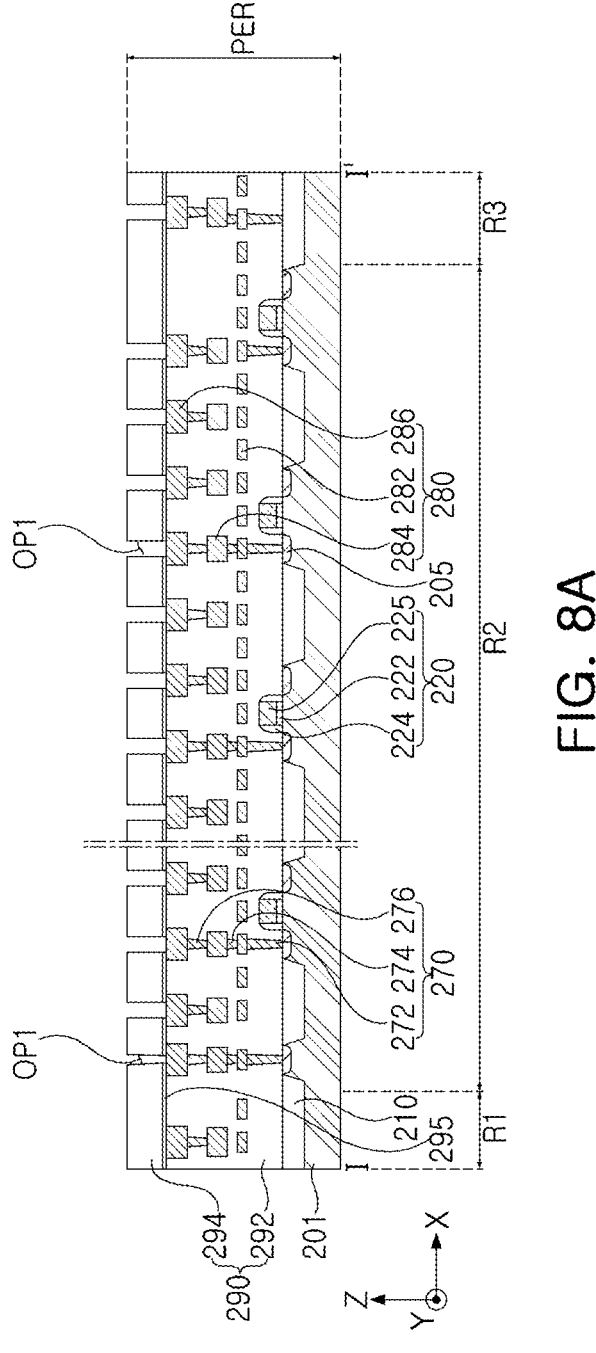
FIGS. 8A to 8K are cross-sectional views illustrating a method of manufacturing a semiconductor device according to an example embodiment of the present disclosure.

Referring to FIG. 8A, circuit devices 220, a lower interconnection structure, and a peripheral region insulating layer 290 included in a peripheral circuit region PERI may be formed on the substrate 201, and first openings OP1 may be formed in the second peripheral insulating layer 294.

First, device isolation layers 210 may be formed in the substrate 201, and a circuit gate dielectric layer 222 and a circuit gate electrode 225 may be formed in order on the substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but the example embodiments thereof are not limited thereto. Thereafter, a spacer layer 224 and impurity regions 205 may be formed on both sidewalls of the circuit gate dielectric layer 222 and the circuit gate electrode 225. In some example embodiments, the spacer layer 224 may include a plurality of layers. The impurity regions 205 may be formed by performing an ion implantation process.

The lower contact plugs 270 of the lower interconnection structure may be formed by partially forming the first peripheral region insulating layer 292, removing a portion by etching, and filling the conductive material. The lower interconnection lines 280 may be formed by, for example, depositing a conductive material and patterning the conductive material.

The first peripheral region insulating layer 292 may include a plurality of insulating layers. A portion of the first peripheral region insulating layer 292 may be formed in each of (or alternatively, at least one of) the processes of forming the lower interconnection structure. A lower protective layer 295 covering an upper surface of the third lower interconnection line 286 may be formed on the first peripheral region insulating layer 292. A second peripheral region insulating layer 294 may be formed on the lower protective layer 295. Accordingly, an entirety of the peripheral circuit regions PERI may be formed.

Thereafter, the first openings OP1 may be formed by partially removing the second peripheral region insulating layer 294. The first openings OP1 may be formed in regions in which the ground via 250, the contact plugs 170 and the through-via 175 in FIG. 2A are to be formed. In some example embodiments, when the first openings OP1 are formed, the lower protective layer 295 may function as an etch stop layer.

The example embodiment in FIG. 4C may be manufactured by forming the first opening OP1 in a region in which the ground via 250 is to be formed in this process.

Figure 8B:
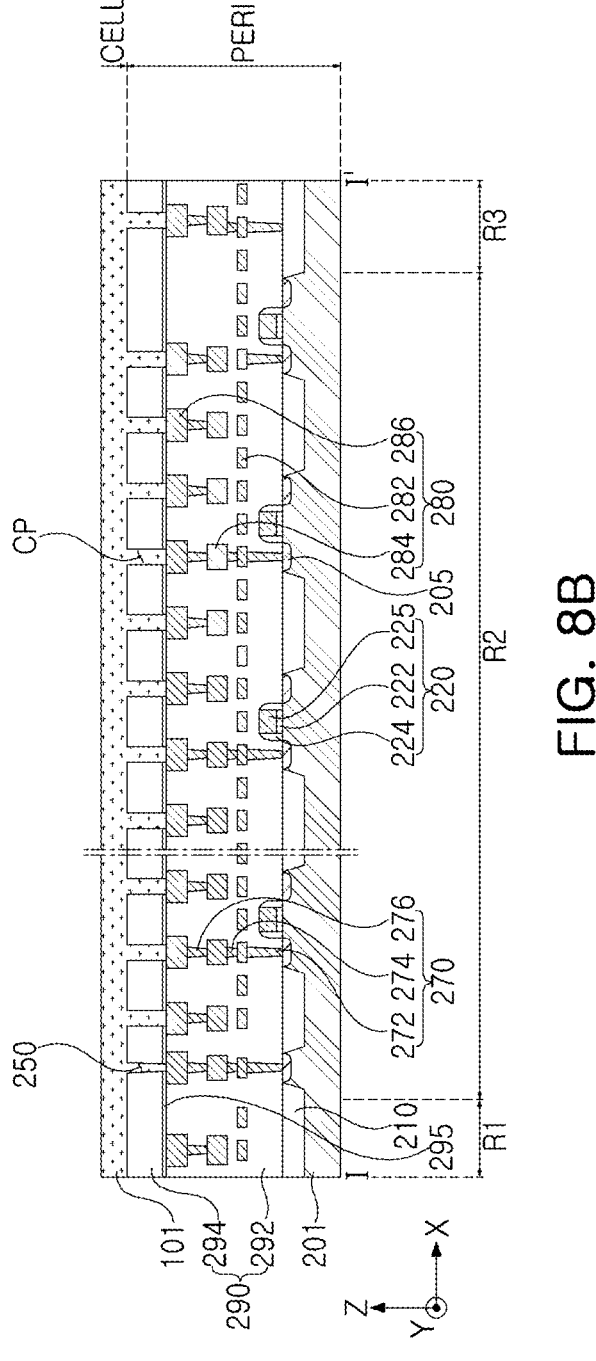

Referring to FIG. 8B, the ground via 250 and the plate layer 101 may be formed.

The plate layer 101 may be formed by filling the first openings OP1 with a material forming the plate layer 101. Accordingly, the ground via 250 and the pads CP may be formed. The pads CP may be layers replaced with the third portions P3 of the contact plugs 170 and the lower region of the through-via 175 in FIGS. 2A and 3A through a subsequent process. The plate layer 101, the ground via 250, and the pads CP may be formed of, for example, polycrystalline silicon, and may be formed by a CVD process.

Figure 8C:
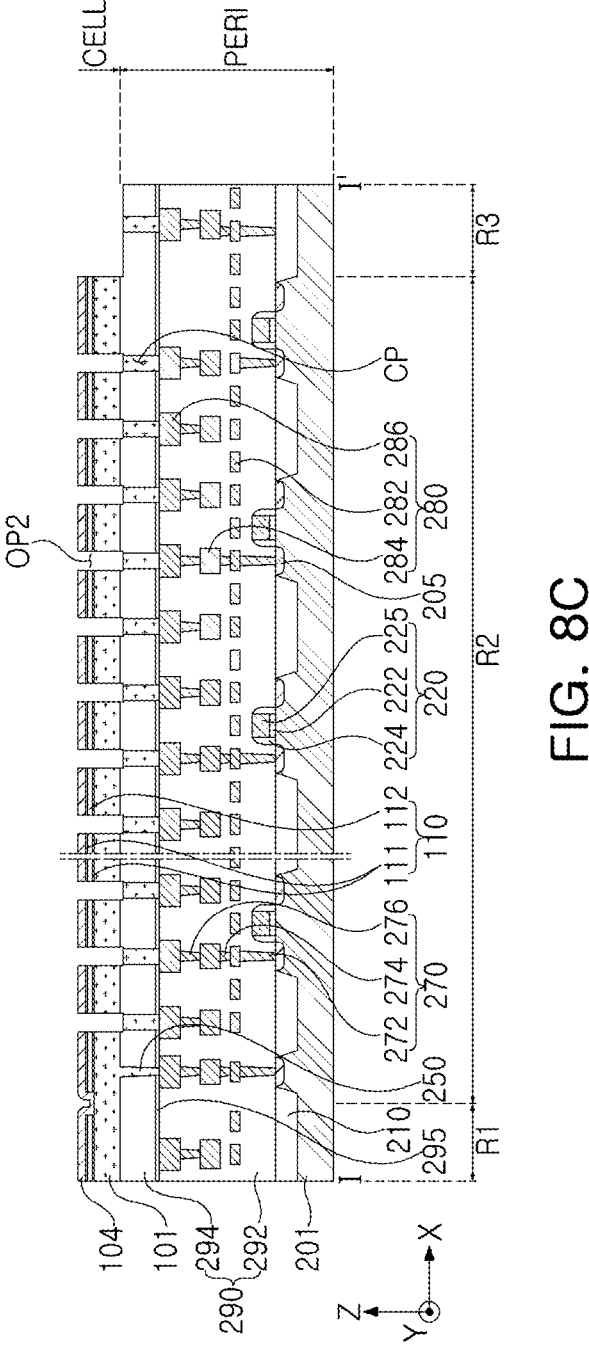

Referring to FIG. 8C, a horizontal insulating layer 110 and a second horizontal conductive layer 104 may be formed on the plate layer 101, and second openings OP2 penetrating through the plate layer 101, the horizontal insulating layer 110, and the second horizontal conductive layer 104 may be formed.

The first and second horizontal insulating layers 111 and 112 included in the horizontal insulating layer 110 may be alternately stacked on the plate layer 101. The horizontal insulating layer 110 may be partially replaced with the first horizontal conductive layer 102 (see FIG. 2A) through a subsequent process. The first horizontal insulating layers 111 may include a material different from that of the second horizontal insulating layer 112. For example, the first horizontal insulating layers 111 may be formed of the same material as a material of the interlayer insulating layers 120, and the second horizontal insulating layer 112 may be formed of the same material as a material of the sacrificial insulating layers 118 subsequently formed. A portion of the horizontal insulating layer 110 may be removed from a portion of regions, that is, for example, from the second region R2 by a patterning process.

The second horizontal conductive layer 104 may be formed on the horizontal insulating layer 110, and may be in contact with the plate layer 101 in a region from which the horizontal insulating layer 110 is removed. Accordingly, the second horizontal conductive layer 104 may be bent along the ends of the horizontal insulating layer 110, may cover the ends, and may extend to the plate layer 101.

The second openings OP2 may be formed by partially removing the plate layer 101, the horizontal insulating layer 110, and the second horizontal conductive layer 104 to expose the pads CP in the second region R2. The second openings OP2 may be formed to a depth lower than a level of the lower surface of the plate layer 101, and may be formed to have a width equal to or greater than a width of the pads CP. When the second openings OP2 are formed, the plate layer 101, the horizontal insulating layer 110, and the second horizontal conductive layer 104 may be removed from the third region R3 such that the pad CP and the second peripheral region insulating layer 294 may be exposed.

The example embodiment in FIG. 4B may be manufactured by forming the second openings OP2 to have a depth equal to a level of the lower surface of the plate layer 101 in this process.

Figure 8D:
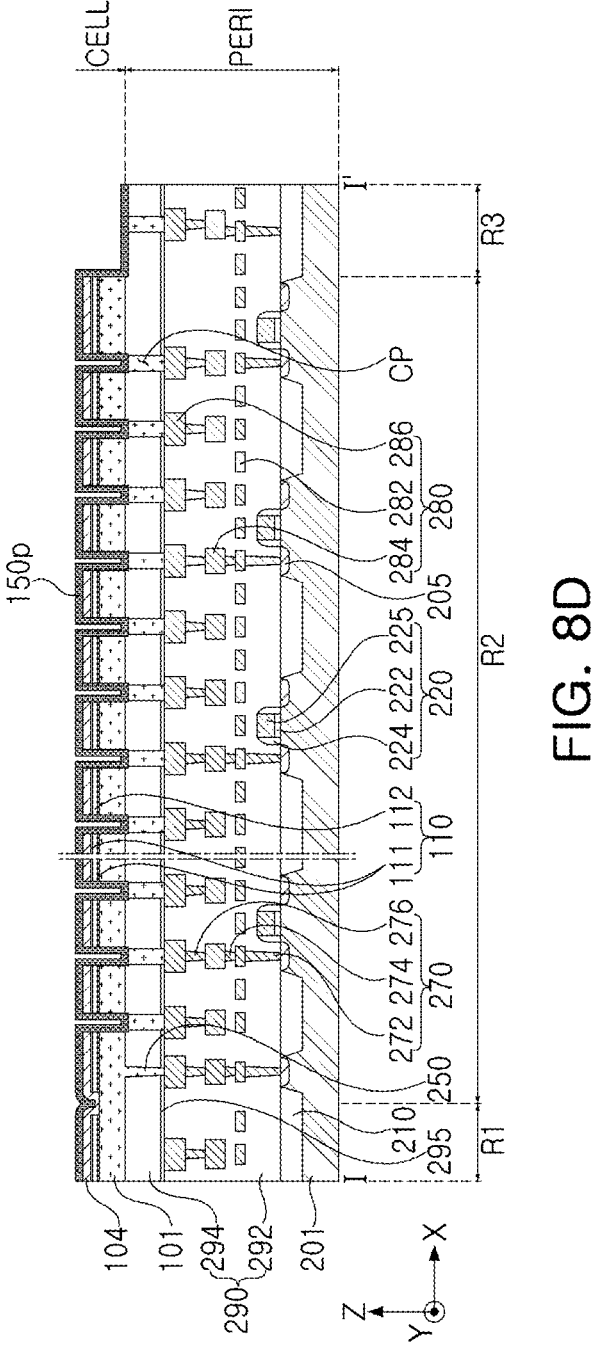

Referring to FIG. 8D, a preliminary spacer layer 150p may be formed.

The preliminary spacer layer 150p may be formed on the upper surface of the second horizontal conductive layer 104, and may be conformally formed to cover side surfaces and bottom surfaces of the second openings OP2. The preliminary spacer layer 150p may cover an external side surface of each of (or alternatively, at least one of) the plate layer 101, the horizontal insulating layer 110, and the second horizontal conductive layer 104, and may extend horizontally along the upper surface of the second peripheral region insulating layer 294 in the third region R3. The thickness of the preliminary spacer layer 150p may be varied in some example embodiments. The preliminary spacer layer 150p may include at least one of silicon carbide (SiC), silicon oxycarbide (SiOC), silicon carbonitride (SiCN), or silicon oxynitride carbide (SiOCN).

The example embodiment in FIG. 4A may be manufactured by forming the preliminary spacer layer 150p in this process, forming the spacer layers 150a by performing an etch-back process as in FIG. 4A, and forming the substrate insulating layer 121 as described with reference to FIG. 8E. In this case, the preliminary spacer layer 150p may be previously removed from the bottom surfaces of the second openings OP2, such that, in a process described below with reference to FIG. 8G, the process of forming the first contact holes OH1 may be performed easily.

Figure 8E:
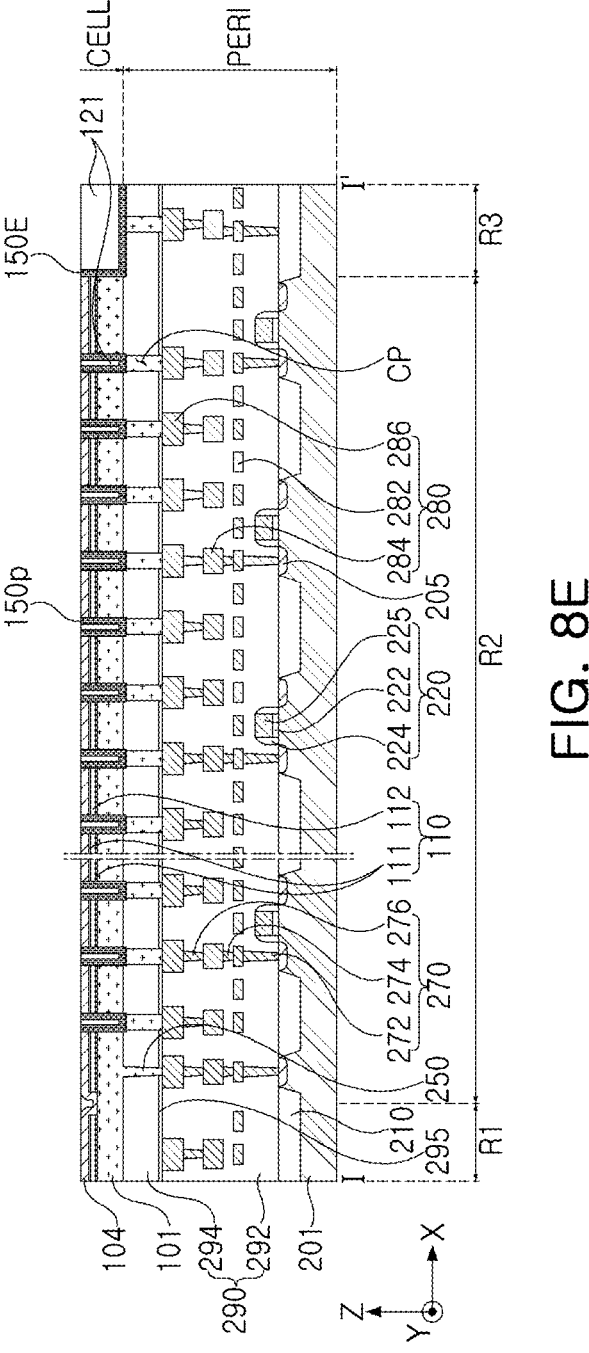

Referring to FIG. 8E, the preliminary spacer layer 150p may be partially removed, and the substrate insulating layer 121 may be formed.

The substrate insulating layer 121 may be formed by depositing an insulating material filling the second openings OP2 and the region of the third region R3 from which the plate layer 101, the horizontal insulating layer 110, and the second horizontal conductive layer 104 are removed, and performing a planarization process such as chemical mechanical planarization (CMP).

By the planarization process, the insulating material and the preliminary spacer layer 150p may be partially removed from an upper surface of the second horizontal conductive layer 104. Accordingly, the external-side insulating layer 150E may be formed on an external side of the third region R3, and the preliminary spacer layer 150p may remain in each of (or alternatively, at least one of) the second openings OP2.

The example embodiment in FIGS. 5A and 5B may be manufactured by performing the planarization process such that the preliminary spacer layer 150p is not removed from an upper surface of the second horizontal conductive layer 104 in this process.

Figure 8F:
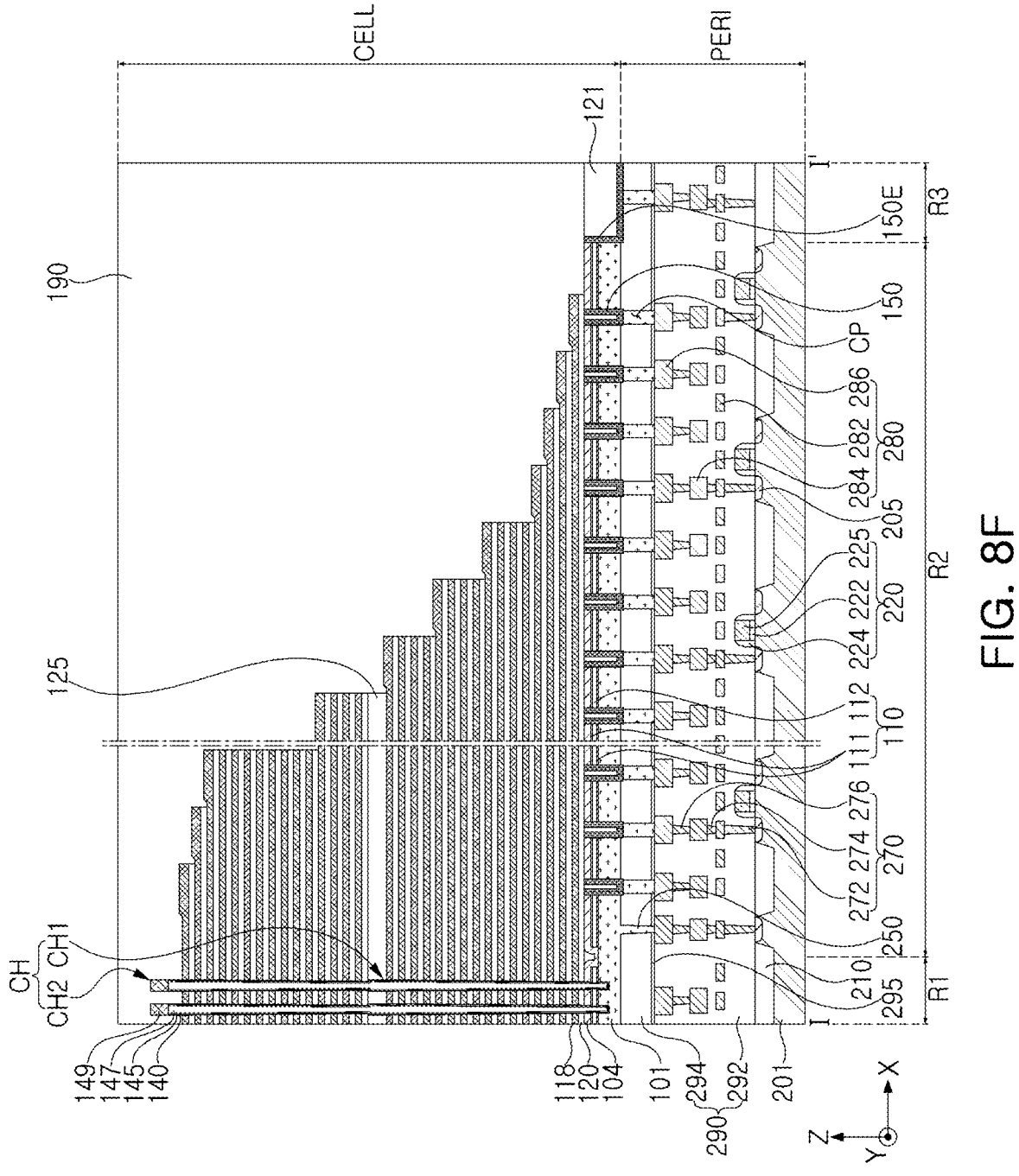

Referring to FIG. 8F, a stack structure may be formed by alternately stacking sacrificial insulating layers 118 and interlayer insulating layers 120 on the second horizontal conductive layer 104, and channel structures CH penetrating through the stack structure may be formed.

The sacrificial insulating layers 118 may be at least partially replaced with the gate electrodes 130 (see FIG. 2A) through a subsequent process. The sacrificial insulating layers 118 may be formed of a material different from a material of the interlayer insulating layers 120, and may be formed of a material which may be etched with etching selectivity with respect to the interlayer insulating layers 120 under specific etching conditions. For example, the interlayer insulating layer 120 may be formed of at least one of silicon oxide and silicon nitride, and the sacrificial insulating layers 118 may be formed of a material different from the material of the interlayer insulating layer 120 selected from among silicon, silicon oxide, silicon carbide, and silicon nitride. In some example embodiments, the thicknesses of the interlayer insulating layers 120 may not be the same. Thereafter, a photolithography process and an etching process may be repeatedly performed on the sacrificial insulating layers 118 using a mask layer such that the upper sacrificial insulating layers 118 may extend shorter than the lower sacrificial insulating layers 118 in the second region R2. Accordingly, the sacrificial insulating layers 118 may form a step structure in a step shape in a predetermined or desired unit. By further forming the sacrificial insulating layers 118 on the step structure, the uppermost sacrificial insulating layers 118 in each region may have a relatively thick thickness.

Thereafter, a cell region insulating layer 190 covering the stack structure may be formed, and upper isolation regions US (see FIG. 2B) may be formed. The upper isolation regions US may be formed by removing a predetermined or desired number of the sacrificial insulating layers 118 and the interlayer insulating layers 120 from an uppermost portion, and forming the upper isolation insulating layer 103 (FIG. 2B) by depositing an insulating material.

The channel structures CH may be formed by anisotropically etching the sacrificial insulating layers 118 and the interlayer insulating layers 120 using a mask layer, and may be formed by forming hole-shaped channel holes and filling the holes. When a plasma dry etching process is used to form the channel holes, a potential difference may be generated in upper and lower portions of the channel holes by ions generated in the channel holes. However, since the second horizontal conductive layer 104 and the plate layer 101 are connected to the substrate 201 by a ground structure including a ground via 250, such that, for example, positive charges may flow to the substrate 201, and negative charges having moved through the mask layer may flow from the edge of the wafer to the substrate 201, and accordingly, arcing failure due to the potential difference may be prevented or hindered.

The channel holes may be formed to be recessed into a portion of the plate layer 101. Channel structures CH may be formed by forming at least a portion of the gate dielectric layer 145, the channel layer 140, the channel filling insulating layer 147, and the channel pad 149 in the channel holes. The gate dielectric layer 145 may be formed to have a uniform thickness using an ALD or CVD process. In this process, an entirety or a portion of the gate dielectric layer 145 may be formed, and a portion extending perpendicularly or substantially perpendicularly to the plate layer 101 along the channel structures CH may be formed in this process. The channel layer 140 may be formed on the gate dielectric layer 145 in the channel holes. The channel filling insulating layer 147 may be formed to fill the channel holes, and may be an insulating material. The channel pad 149 may be formed of a conductive material, such as, for example, polycrystalline silicon.

After forming the channel structures CH, the support structures DCH (see FIG. 1) may be formed in a similar manner For example, the support structures DCH may be formed by forming support holes penetrating through the stack structure and filling the support holes with an insulating material.

Figure 8G:
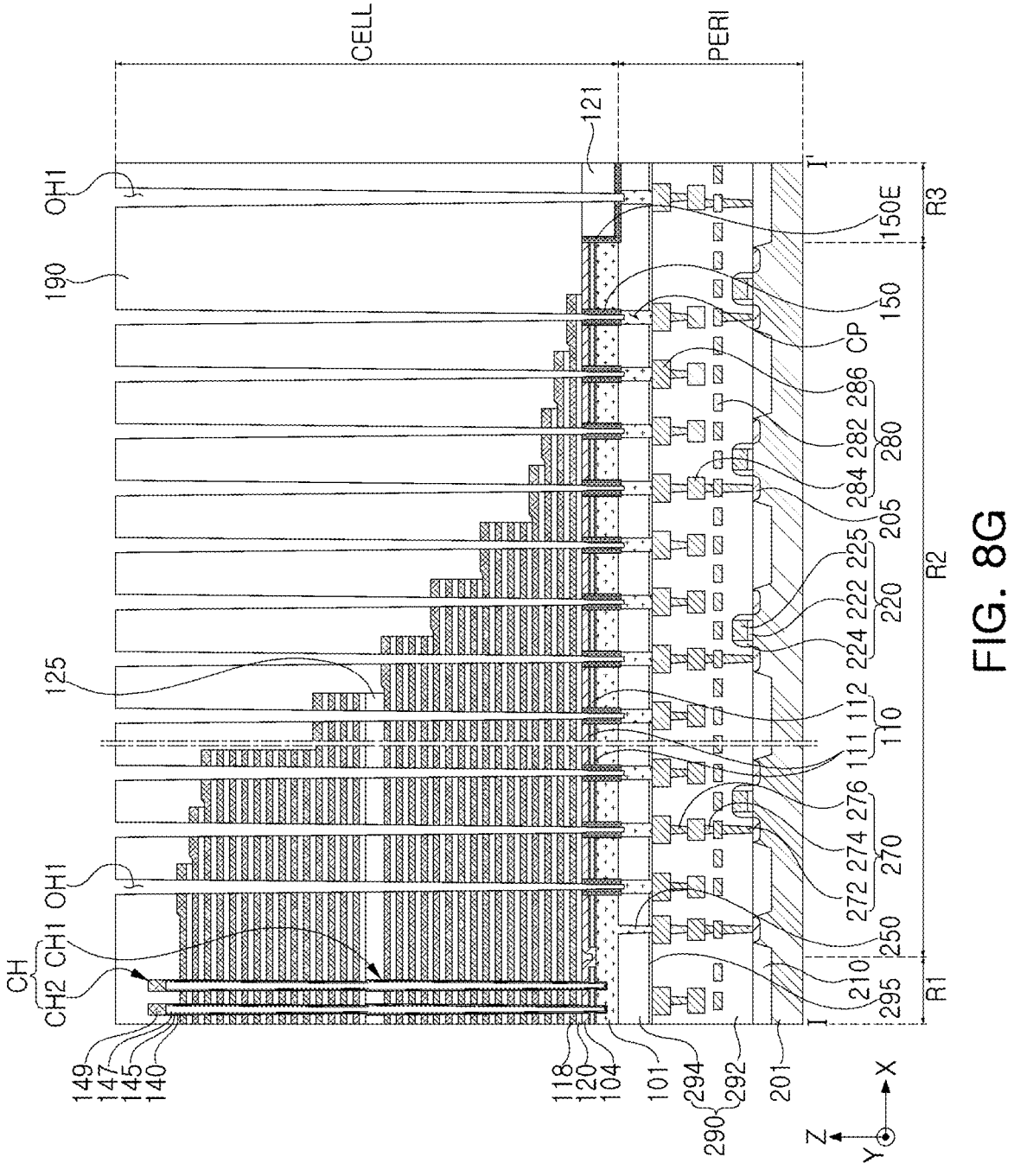

Referring to FIG. 8G, first contact holes OH1 may be formed, thereby forming spacer layers 150.

The first contact holes OH1 may be formed in regions corresponding to the contact plugs 170 and the through-via 175 in FIG. 2A. The first contact holes OH1 may be formed to penetrate the cell region insulating layer 190, the sacrificial insulating layers 118, and the interlayer insulating layers 120 in regions corresponding to the contact plugs 170, and to penetrate the substrate insulating layer 121 in a lower portion. The first contact holes OH1 may penetrate through the cell region insulating layer 190, the substrate insulating layer 121, and the external-side insulating layer 150E in a region corresponding to the through-via 175. The pads CP may be exposed through bottom surfaces of the first contact holes OH1.

When the first contact holes OH1 are formed, an etching process may be performed under a condition in which etching selectivity for the preliminary spacer layers 150p is relatively low as compared to the cell region insulating layer 190, the sacrificial insulating layers 118, the interlayer insulating layers 120, and the substrate insulating layer 121. Also, the preliminary spacer layers 150p may be formed of a material having an etching rate slower than that of the substrate insulating layer 121. Accordingly, in this process, the first contact holes OH1 may be self-aligned in the form of removing the substrate insulating layers 121 filling the spaces between the preliminary spacer layers 150p. In some example embodiments, in the region penetrating the substrate insulating layer 121 between the preliminary spacer layers 150p, the widths of the first contact holes OH1 may be relatively reduced.

By this process, the spacer layers 150 may be disposed only in regions between the first contact holes OH1 and the plate layer 101, the horizontal insulating layer 110, and the second horizontal conductive layer 104. Also, the spacer layers 150 may be etched relatively greatly in an upper portion such that the spacer layers 150 may have a shape in which a thickness in an upper portion may be smaller than a thickness in a lower portion.

In this process, as the first contact holes OH1 are self-aligned by the preliminary spacer layers 150p, the shape thereof in the lower portion of the first contact holes OH1 may be controlled to not be disported. Accordingly, defects such as connection defects caused by the remaining vertical sacrificial layers 119 (see FIG. 8H) may be prevented or hindered, and such that defects of the finally formed contact plugs 170 may be prevented or hindered.

Figure 8H:
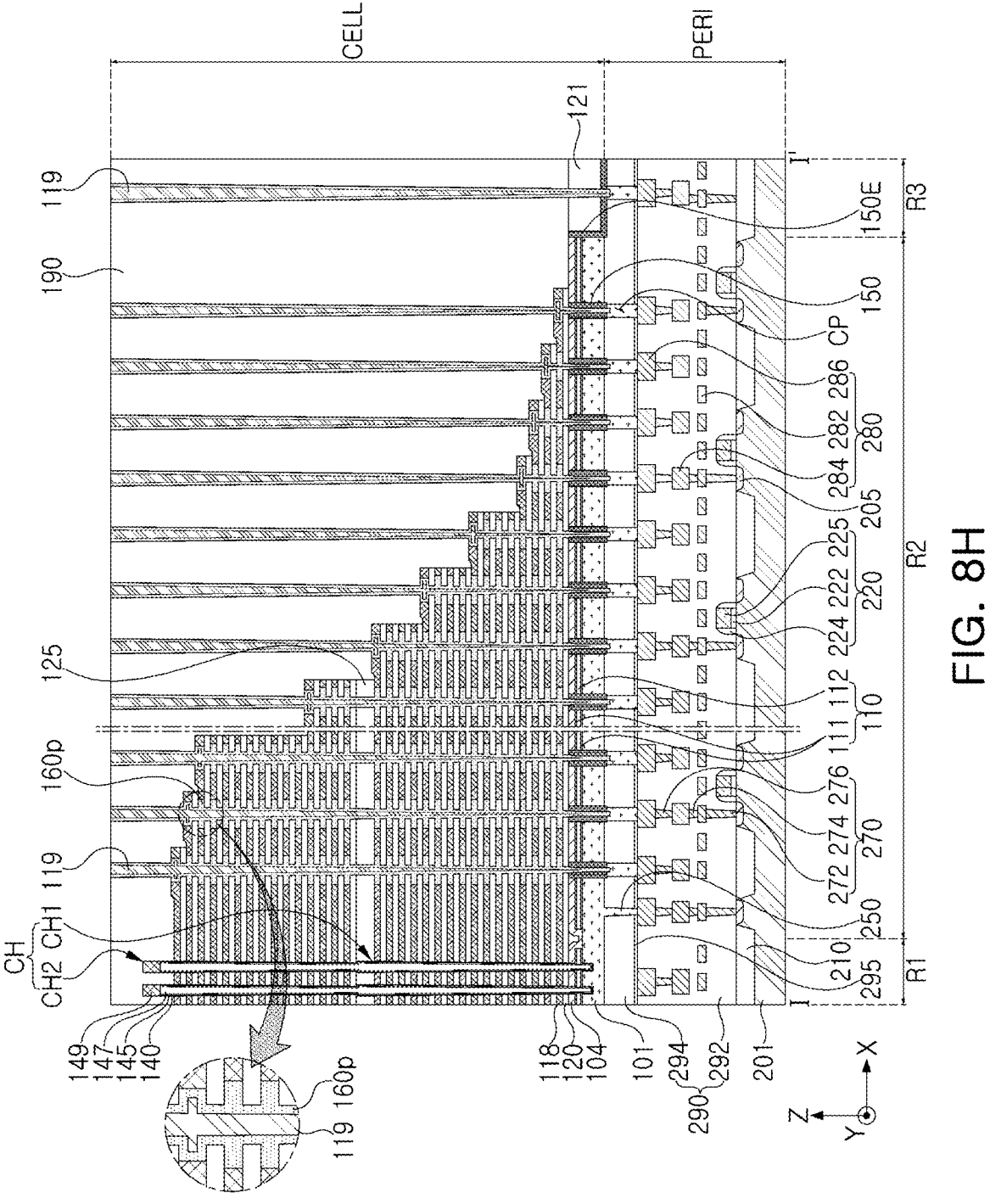

Referring to FIG. 8H, preliminary contact insulating layers 160p may be formed in the first contact holes OH1, and vertical sacrificial layers 119 may be formed.

A portion of the sacrificial insulating layers 118 exposed through the first contact holes OH1 may be removed. Tunnel portions may be formed by removing the sacrificial insulating layers 118 to a predetermined or desired length around the first contact holes OH1. The tunnel portions may be formed to have a relatively short length in the uppermost sacrificial insulating layers 118, and may be formed to have a relatively long length in the sacrificial insulating layers 118 therebelow.

Specifically, first, the tunnel portions may be formed to be relatively long in the uppermost sacrificial insulating layers 118, which may be due to the uppermost sacrificial insulating layers 118 may include a region in which a etch rate is higher than that of the sacrificial insulating layers 118 therebelow. Thereafter, separate sacrificial layers may be formed in the first contact holes OH1 and the tunnel portions. The sacrificial layer may be formed of a material having an etching rate slower than that of the sacrificial insulating layers 118. Thereafter, the sacrificial layer and a portion of the sacrificial insulating layers 118 may be removed, and in this case, the sacrificial layer may remain in an uppermost portion and the sacrificial insulating layers 118 may be partially removed after the sacrificial layer is removed in a lower portion. Accordingly, the tunnel portions may be formed to have a relatively short length in the uppermost sacrificial insulating layers 118.

The preliminary contact insulating layers 160p may be formed by depositing an insulating material in the first contact holes OH1 and the tunnel portions. The preliminary contact insulating layers 160p may be formed on sidewalls of the first contact holes OH1 and may fill the tunnel portions. In the uppermost sacrificial insulating layers 118, the first contact holes OH1 may not completely fill the tunnel portions.

The vertical sacrificial layers 119 may fill the first contact holes OH1 and may fill the uppermost tunnel portions. The vertical sacrificial layers 119 may include a material different from that of the preliminary contact insulating layers 160p, such as, for example, polycrystalline silicon.

Figure 8I:
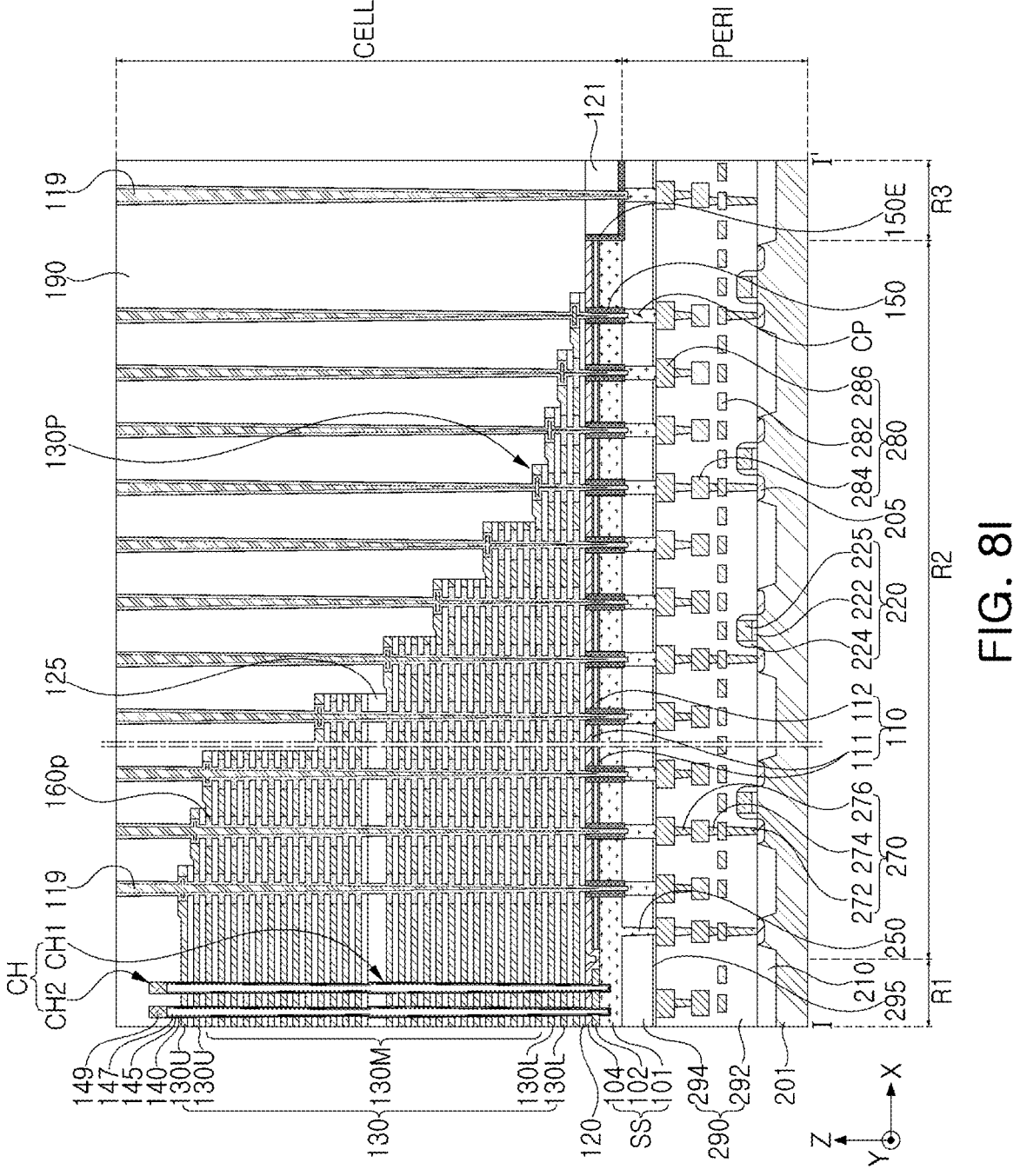

Referring to FIG. 8I, the first horizontal conductive layer 102 may be formed, the sacrificial insulating layers 118 may be removed, and the gate electrodes 130 may be formed.

First, openings penetrating through the sacrificial insulating layers 118 and the interlayer insulating layers 120 and extending to the plate layer 101 may be formed in the position of the first and second isolation regions MS1, MS2a, and MS2b (see FIG. 1). Thereafter, by performing an etch-back process while forming sacrificial spacer layers in the openings, the horizontal insulating layer 110 may be selectively removed from the first region R1, and a portion of the exposed gate dielectric layer 145 may also be removed. The first horizontal conductive layer 102 may be formed by depositing a conductive material in the region from which the horizontal insulating layer 110 is removed, and the sacrificial spacer layers may be removed from the openings. Through this process, the first horizontal conductive layer 102 may be formed in the first region R1.

Thereafter, the sacrificial insulating layers 118 may be selectively removed with respect to the interlayer insulating layers 120, the second horizontal conductive layer 104, and the preliminary contact insulating layers 160p using, for example, wet etching. The gate electrodes 130 may be formed by depositing a conductive material in regions from which the sacrificial insulating layers 118 are removed. The conductive material may include a metal, polycrystalline silicon, or a metal silicide material. In some example embodiments, a portion of the gate dielectric layer 145 may be formed preferentially before the gate electrodes 130 are formed. After the gate electrodes 130 are formed, isolation insulating layers 105 may be formed in the openings formed in the regions of the first and second isolation regions MS1, MS2*a*, and MS2*b*.

Figure 8J:
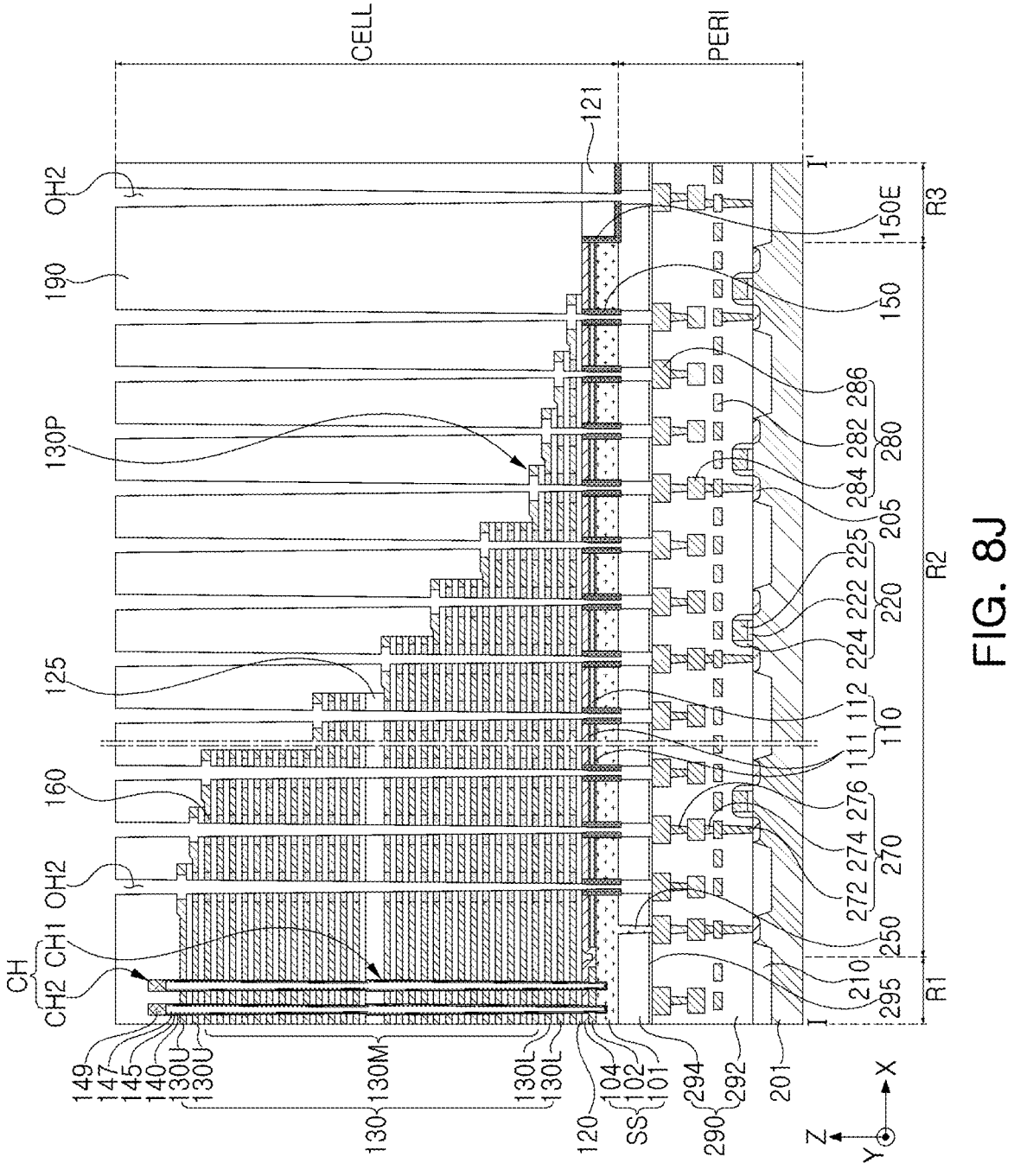

Referring to FIG. 8J, second contact holes OH2 may be formed by removing the vertical sacrificial layers 119 and removing the exposed pads CP.

The vertical sacrificial layers 119 in the first contact holes OH1 may be selectively removed with respect to the interlayer insulating layers 120 and the gate electrodes 130. After the vertical sacrificial layers 119 are removed, the exposed preliminary contact insulating layers 160p may also be partially removed. In this case, an entirety of the preliminary contact insulating layers 160p may be removed from the pad regions 130P, and the preliminary contact insulating layers 160p may remain therebelow and may form the contact insulating layers 160. In the pad regions 130P, when the gate dielectric layer 145 is exposed after the preliminary contact insulating layers 160p are removed, the gate dielectric layer 145 may also be removed to expose side surfaces of the gate electrodes 130.

By removing the vertical sacrificial layers 119, the pads CP therebelow may be exposed. The pads CP may be selectively removed with respect to the spacer layers 150, the plate layer 101, the substrate insulating layer 121, and the peripheral region insulating layer 290. The pads CP may be removed by, for example, wet etching. Accordingly, second contact holes OH2 extending downwardly from the first contact holes OH1 may be formed.

Figure 8K:
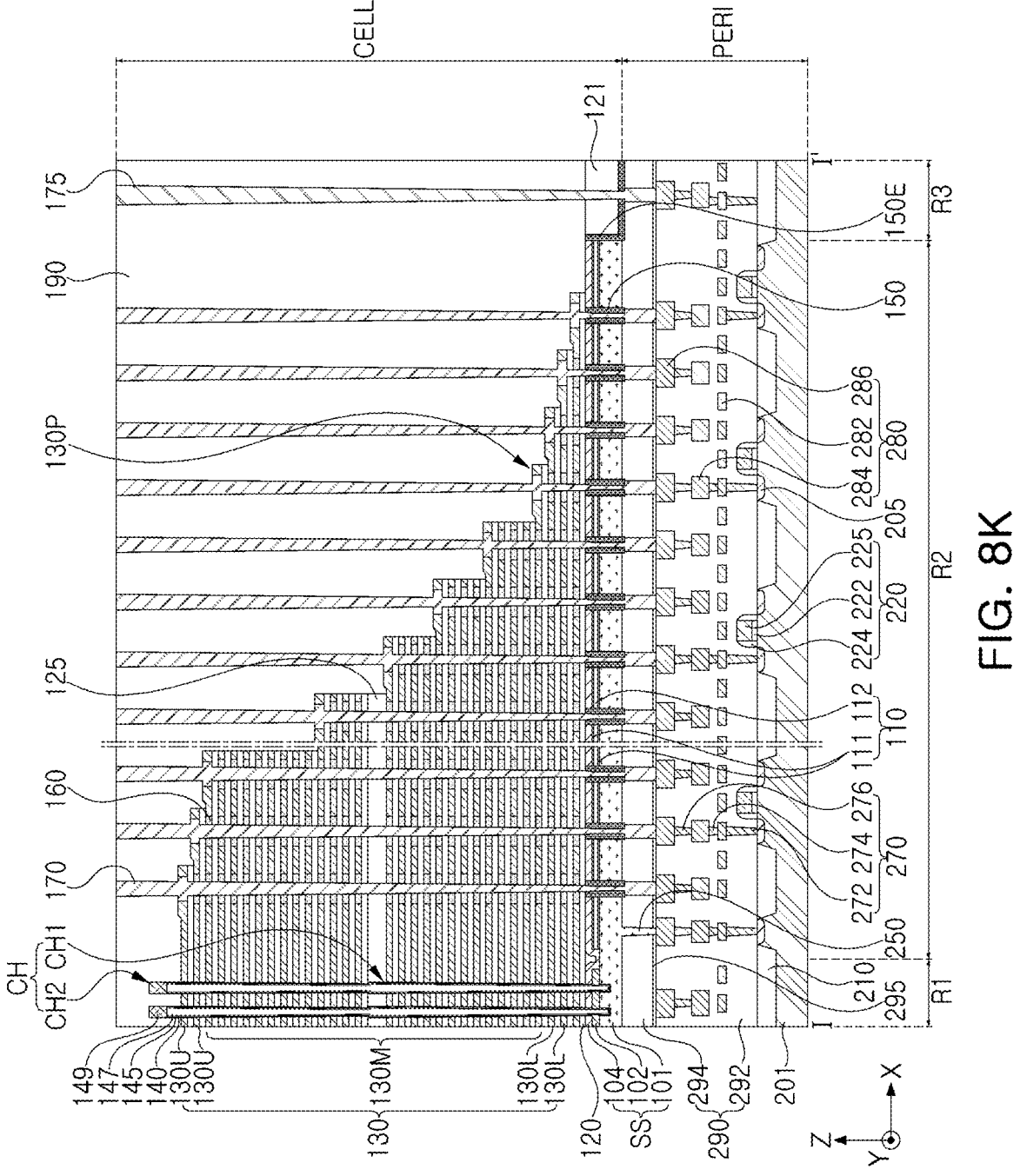

Referring to FIG. 8K, a conductive material may be deposited in the second contact holes OH2 such that contact plugs 170 and a through-via 175 may be formed.

Since the contact plugs 170 and the through-via 175 are formed together in the same process, the contact plugs 170 and the through-via 175 may have the same structure. The contact plugs 170 may be formed to have a horizontal extension portion 170H (see FIG. 3B) in the pad regions 130P, and accordingly, the contact plugs 170 may be physically and electrically connected to the gate electrodes 130.

Thereafter, referring to FIG. 2A, by forming upper contact plugs 180 connected to the upper ends of the channel structures CH, the contact plugs 170, and the through-via 175, the semiconductor device 100 may be manufactured.

Figure 9:
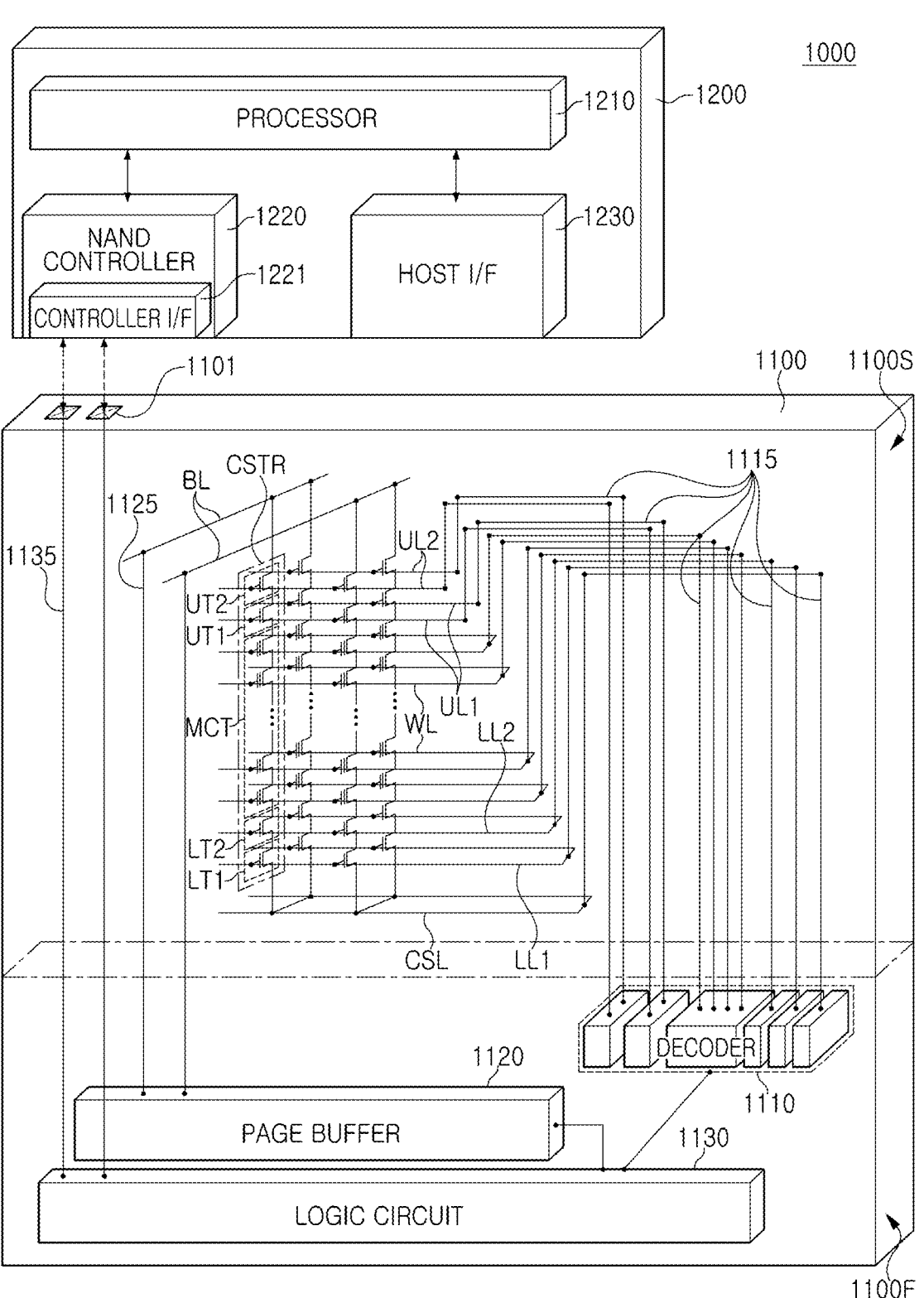
FIG. 9 is a view illustrating a data storage system including a semiconductor device according to an example embodiment of the present disclosure.

FIG. 9 is a view illustrating a data storage system including a semiconductor device according to an example embodiment.

Referring to FIG. 9, the data storage system 1000 may include a semiconductor device 1100 and a controller 1200 electrically connected to the semiconductor device 1100.

The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described in the aforementioned example embodiment with reference to FIGS. 1 to 7. The semiconductor device 1100 may include a first structure 1100F and a second structure 1100S on the first structure 1100F. In some example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of (or alternatively, at least one of) the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in some example embodiments.

In some example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first structure 1100F to the second structure 1100S. The bit lines BL may be electrically connected to the page buffer 1120 through second connection interconnections 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface (UF) 1230. In some example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined or desired firmware, and may access the semiconductor device 1100 by controlling the NAND controller 1220. The NAND controller 1220 may include a NAND controller interface (UF) 1221 processing communication with the semiconductor device 1100. Through the NAND controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

10 is a perspective view illustrating a data storage system including a semiconductor device according to an example embodiment.

Figure 10:
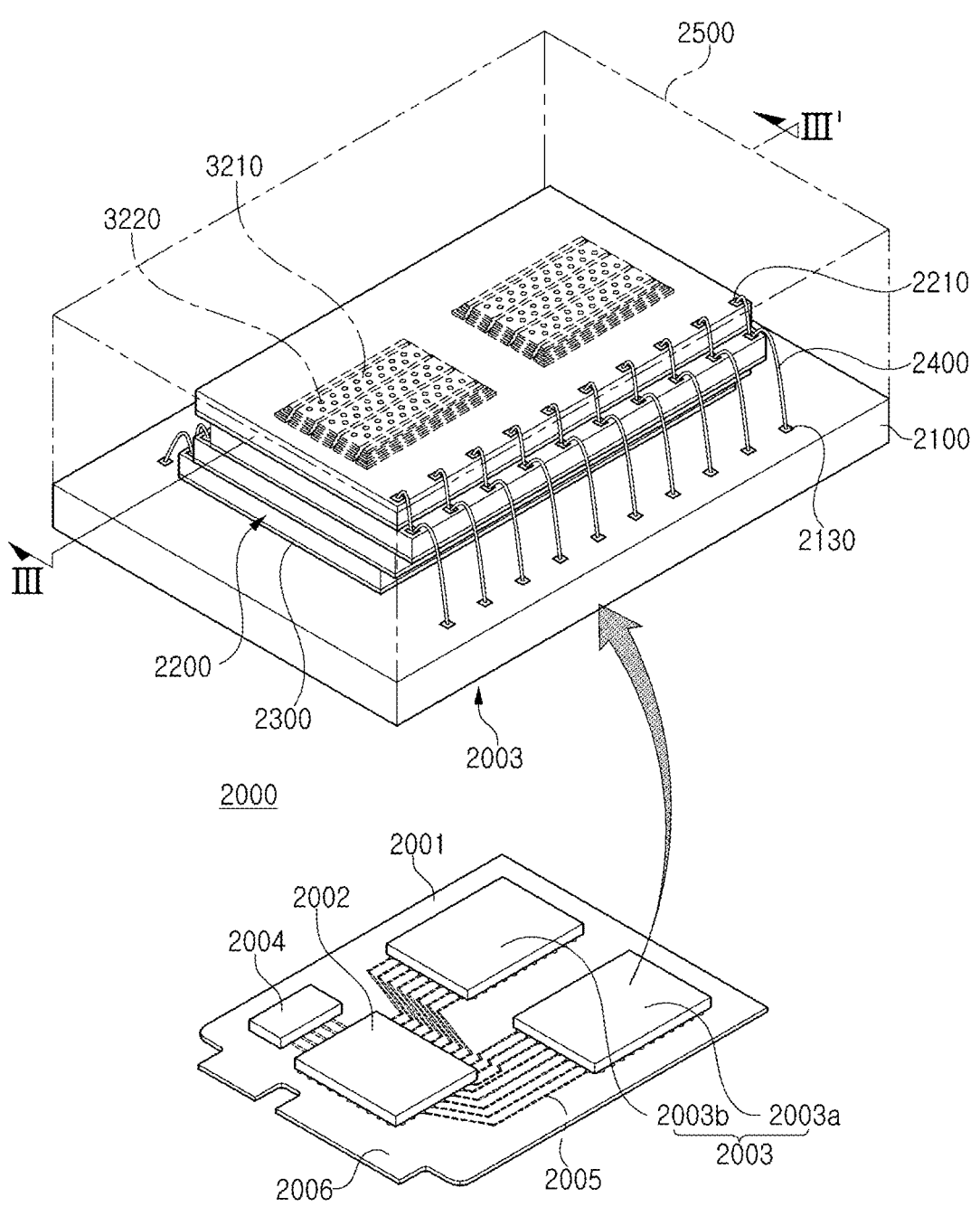
FIG. 10 is a perspective view illustrating a data storage system including a semiconductor device according to an example embodiment of the present disclosure.

Referring to FIG. 10, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and arrangement of the plurality of pins in the connector 2006 may vary depending on a communication interface between the data storage system 2000 and the external host. In some example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of (or alternatively, at least one of) the first and second semiconductor packages 2003a and 2003b may be configured as a semiconductor package including a plurality of semiconductor chips 2200. Each of (or alternatively, at least one of) the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 9. Each of (or alternatively, at least one of) the semiconductor chips 2200 may include gate stack structures 3210 and channel structures 3220. Each of (or alternatively, at least one of) the semiconductor chips 2200 may include the semiconductor device described in the aforementioned example embodiment with reference to FIGS. 1 to 7.

In some example embodiments, the connection structure 2400 may be configured as a bonding wire electrically connecting the input/output pad 2210 to the upper package pads 2130. Accordingly, in each of (or alternatively, at least one of) the first and second semiconductor packages 2003a and 2003b, the semiconductor chips 2200 may be electrically connected to each other by a bonding wire method, and may be electrically connected to the package upper pads 2130 of the package substrate 2100. In some example embodiments, in each of (or alternatively, at least one of) the first and second semiconductor packages 2003a and 2003b, the semiconductor chips 2200 may be electrically connected to each other by a connection structure including a through-electrode (TSV) instead of the connection structure 2400 of a bonding wire method.

In some example embodiments, the controller 2002 and the semiconductor chips 2200 may be included in a single package. In an example embodiment, the controller 2002 and the semiconductor chips 2200 may be mounted on a separate interposer substrate different from the main substrate 2001, and the controller 2002 and the semiconductor chips 2200 may be connected to each other interconnection formed on the interposer substrate.

Figure 11:
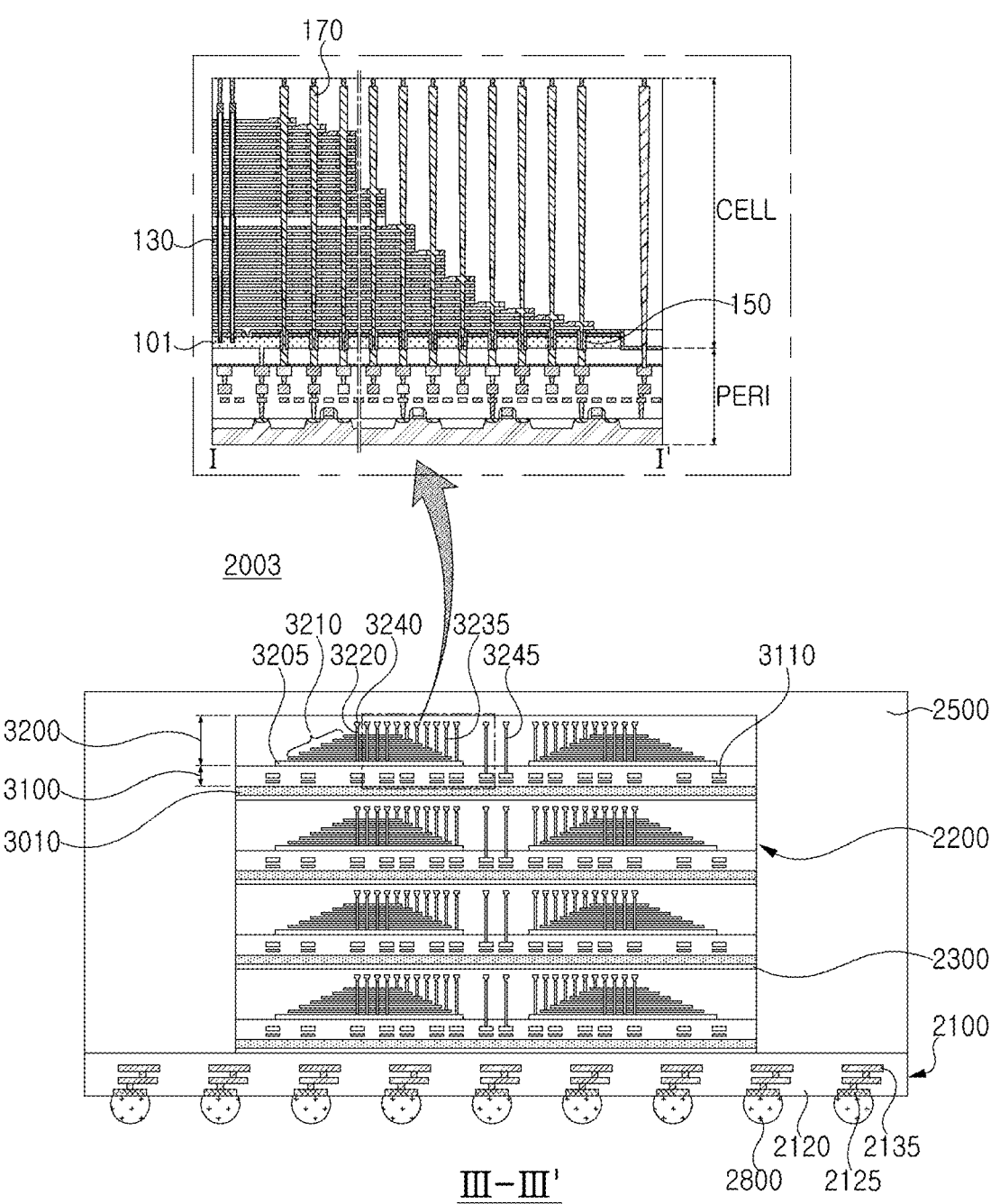
FIG. 11 is a cross-sectional view illustrating a semiconductor package according to an example embodiment of the present disclosure.

FIG. 11 is a cross-sectional view illustrating a semiconductor package according to an example embodiment, illustrating an example embodiment of the semiconductor package 2003 in FIG. 10 taken along line III-III' in FIG. 11.

Referring to FIG. 11, in the semiconductor package 2003, the package substrate 2100 may be implemented as a printed circuit board. The package substrate 2100 may include a package substrate body 2120, package upper pads 2130 (see FIG. 10) disposed on the upper surface of the package substrate body 2120, lower pads 2125 disposed on the lower surface of the package substrate body 2120 or exposed through the lower surface, and internal interconnections 2135 electrically connecting the upper pads 2130 to the lower pads 2125 in the package substrate body 2120. The lower pads 2125 may be connected to the interconnection patterns 2005 of the main substrate 2010 of the data storage system 2000 as illustrated in FIG. 10 through conductive connection portions 2800.

Each of (or alternatively, at least one of) the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 penetrating through the gate stack structure 3210, bit lines 3240 electrically connected to the memory channel structures 3220, and contact plugs 3235 electrically connected to the word lines WL (see FIG. 9) of the gate stack structure 3210. As described in the aforementioned example embodiment with reference to FIGS. 1 to 7, each of (or alternatively, at least one of) the semiconductor chips 2200 may further include spacer layers 150 disposed between the contact plugs 170 and 3235 and the plate layer 101.

Each of (or alternatively, at least one of) the semiconductor chips 2200 may include a through interconnection 3245 electrically connected to the peripheral interconnections 3110 of the first structure 3100 and extending into the second structure 3200. The through interconnection 3245 may be disposed on an external side of the gate stack structure 3210, and may be further disposed to penetrate through the gate stack structure 3210. Each of (or alternatively, at least one of) the semiconductor chips 2200 may further include an input/output pad 2210 (see FIG. 10) electrically connected to the peripheral interconnections 3110 of the first structure 3100.

According to the aforementioned example embodiments, by controlling shapes of the contact plugs by disposing a spacer layer between the contact plugs and the source structure, a semiconductor device having improved reliability may be provided.

Any of the elements and/or functional blocks disclosed above may include or be implemented in processing circuitry such as hardware including logic circuits; a hardware/software combination such as a processor executing software; or a combination thereof. For example, controller 1200, processor 1210, and NAND controller 1220 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While some example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
   a first semiconductor structure including a substrate, circuit devices on the substrate, lower interconnection lines on the circuit devices, and a peripheral region insulating layer covering the lower interconnection lines; and
   a second semiconductor structure on the first semiconductor structure, having first and second regions, and including,
   a source structure,
   gate electrodes stacked on the source structure and spaced apart from each other in a first direction perpendicular to an upper surface of the source structure,
   channel structures penetrating the gate electrodes in the first region, the channel structures extending in the first direction, and each of the channel structures including a channel layer,
   contact plugs extending in the first direction in the second region, the contact plugs penetrating through the gate electrodes and the source structure, and the contact plugs connected to a portion of the lower interconnection lines, and
   spacer layers between the contact plugs and the source structure,
   wherein the spacer layers include a material different from a material of the peripheral region insulating layer,
   wherein each of the contact plugs includes a first portion on the source structure, a second portion surrounded by the spacer layers, and a third portion below the second portion, and wherein the first portion has a first width, the second portion has a second width smaller than the first width, and the third portion has a third width greater than the second width.

2. The semiconductor device of claim 1, wherein the third width is greater than the first width.

3. The semiconductor device of claim 1, wherein lower surfaces of the spacer layers are on a level lower than a level of a lower surface of the source structure.

4. The semiconductor device of claim 1, wherein a width of each of the spacer layers on an upper surface is smaller than a width on a bottom surface.

5. The semiconductor device of claim 1, wherein each of the spacer layers has a width of about 100 nm to about 250 nm.

6. The semiconductor device of claim 1, wherein the spacer layers include at least one of silicon carbide (SiC), silicon oxycarbide (SiOC), silicon carbonitride (SiCN), and silicon oxynitride carbide (SiOCN).

7. The semiconductor device of claim 1, wherein, each of the contact plugs includes a side surface of the second portion, and the side surface of the second portion of each of the contact plugs has non-uniform inclination.

8. The semiconductor device of claim 1, wherein, in each of the contact plugs the first portion, the second portion, and the third portion are included in a single layer.

9. The semiconductor device of claim 1, wherein the spacer layers extend to the upper surface of the source structure and the spacer layers cover the upper surface of the source structure.

10. The semiconductor device of claim 1, wherein upper ends of the spacer layers are on a level which is a same level as or a lower level than a level of the upper surface of the source structure.

11. The semiconductor device of claim 1,
wherein the second semiconductor structure further includes a through-via extending in an external side of the source structure in the first direction and the through-via is connected to one of the lower interconnection lines, and
wherein the through-via is on a same level as a level of the contact plugs, and the through-via has a shape different from a shape of the contact plugs.

12. The semiconductor device of claim 11,
wherein the second semiconductor structure further includes an external-side insulating layer covering an external side surface of the source structure, the external-side insulating layer extending to an upper surface of the peripheral region insulating layer, and the external-side insulating layer including a same material as a material of the spacer layers, and
wherein the through-via penetrates the external-side insulating layer.

13. The semiconductor device of claim 1,
wherein the second semiconductor structure further includes a ground via extending from a lower surface of the source structure in the first direction and the ground via is connected to one of the lower interconnection lines, and
wherein the ground via is integrated with the source structure.

14. The semiconductor device of claim 13, wherein, in each of the contact plugs the third portion overlaps the ground via in a second direction perpendicular to the first direction.

15. The semiconductor device of claim 1, wherein the source structure includes:

a plate layer on the peripheral region insulating layer;
a first horizontal conductive layer on the plate layer in the first region; and
a second horizontal conductive layer on the first horizontal conductive layer and the second horizontal conductive layer extending to the second region.

16. A semiconductor device, comprising:
a substrate;
circuit devices on the substrate;
lower interconnection lines electrically connected to the circuit devices;
a peripheral region insulating layer covering the lower interconnection lines;
a source structure on the peripheral region insulating layer;
gate electrodes stacked on the source structure and spaced apart from each other in a first direction perpendicular to an upper surface of the source structure;
channel structures penetrating through the gate electrodes, the channel structures extending in the first direction, and each of the channel structures including a channel layer;
contact plugs penetrating through the gate electrodes and the source structure, the contact plugs extending in the first direction, and the contact plugs each connected to a portion of the lower interconnection lines; and
spacer layers between the contact plugs and the source structure, and the spacer layers including a material different from a material of the peripheral region insulating layer,
wherein each of the spacer layers has a first width on an upper surface and each of the spacer layers has a second width greater than the first width on a lower surface.

17. The semiconductor device of claim 16, wherein each of the contact plugs includes a first region in which a width thereof does not uniformly decrease downwardly, the first region being in a region of the contact plug surrounded by the spacer layers.

18. The semiconductor device of claim 16, wherein each of the contact plugs has a first diameter on a level of the upper surface of the source structure, each of the contact plugs has a second diameter smaller than the first diameter on a level of a lower surface of the source structure, and each of the contact plugs has a third diameter greater than the second diameter on a lower surface of each of the contact plugs.

19. A data storage system, comprising:
a semiconductor storage device including
a substrate, circuit devices on the substrate,
lower interconnection lines electrically connected to the circuit devices,
a peripheral region insulating layer covering the lower interconnection lines,
a plate layer on the peripheral region insulating layer,
gate electrodes stacked and spaced apart from each other in a first direction perpendicular to an upper surface of the plate layer on the plate layer,
contact plugs penetrating through the gate electrodes and the plate layer, the contact plugs extending in the first direction, and each of the contact plugs connected to a portion of the lower interconnection lines,
spacer layers between the contact plugs and the plate layer and the spacer layers including a material different from a material of the peripheral region insulating layer, and input/output pads electrically connected to the circuit devices, wherein a controller is electrically connected to the semiconductor storage device through the input/output pad and the controller is configured to control the semiconductor storage device, and wherein each of the contact plugs has a first width on a level of a lower surface of the plate layer, and each of the contact plugs has a second width greater than the first width on a lower surface of each of the contact plugs.

20. The data storage system of claim 19, wherein each of the spacer layers has a third width on an upper surface and each of the spacer layers has a fourth width greater than the third width on a lower surface.

* * * * *